(12) United States Patent
Popescu

(10) Patent No.: US 11,789,098 B2
(45) Date of Patent: Oct. 17, 2023

(54) MEASUREMENT DEVICE AND METHOD FOR MEASURING MAGNETIC RESONANCE SIGNALS IN A MAGNETIC RESONANCE DEVICE AND MAGNETIC RESONANCE DEVICE

(71) Applicant: Siemens Healthcare GmbH, Erlangen (DE)

(72) Inventor: Stefan Popescu, Erlangen (DE)

(73) Assignee: Siemens Healthcare GmbH, Erlangen (DE)

( * ) Notice: Subject to any disclaimer, the term of this patent is extended or adjusted under 35 U.S.C. 154(b) by 164 days.

(21) Appl. No.: 17/377,515

(22) Filed: Jul. 16, 2021

(65) Prior Publication Data

US 2022/0018912 A1    Jan. 20, 2022

Related U.S. Application Data

(60) Provisional application No. 63/053,067, filed on Jul. 17, 2020.

(51) Int. Cl.
*G01R 33/24* (2006.01)
*G01R 33/00* (2006.01)
(Continued)

(52) U.S. Cl.
CPC ......... *G01R 33/24* (2013.01); *G01R 33/0017* (2013.01); *G01R 33/0322* (2013.01);
(Continued)

(58) Field of Classification Search
CPC ............... G01R 33/24; G01R 33/0017; G01R 33/0322; G01R 33/3621; G01R 33/3692;
(Continued)

(56) References Cited

U.S. PATENT DOCUMENTS 6,800,913 B2    10/2004  Johnson et al.
9,702,900 B2    7/2017   Yacoby et al.
(Continued)

FOREIGN PATENT DOCUMENTS

| DE | 102018203845 A1 | | 9/2019 | |
|---|---|---|---|---|
| DE | 102020208180 A1 | | 12/2021 | |
| WO | WO-2012159896 A1 | * | 11/2012 | ............. B82Y 10/00 |

*Primary Examiner* — Christopher P McAndrew
(74) *Attorney, Agent, or Firm* — Banner & Witcoff Ltd.

(57) ABSTRACT

A measurement device for measuring MR signals in a MR device may include first and second magnetometers and a controller. The first magnetometer may be a quantum spin magnetometer that includes a sensor material having a spin defect center including Zeeman splitting states dependent on an external magnetic field of the MR device, an optical excitation source and a microwave excitation source for electromagnetically exciting the sensor material, and a measurement sensor for measuring optical signals emitted by the excited sensor material element and depending on the Zeeman splitting states. The controller may be configured to determine a working frequency of the microwave excitation source of the first magnetometer from the total magnetic field strength measured by the second magnetometer, and control the microwave excitation source to use the determined working frequency as microwave frequency, such that the first magnetometer measures the MR signals as the optical signal.

17 Claims, 8 Drawing Sheets

Figure 1:
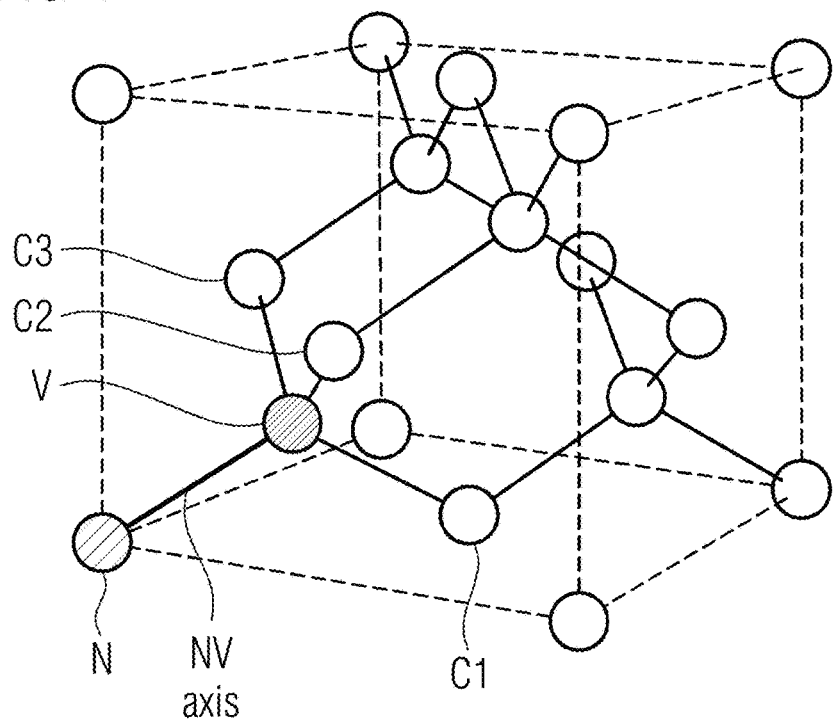

(51) Int. Cl.
*G01R 33/36* (2006.01)
*G01R 33/381* (2006.01)
*G01R 33/032* (2006.01)

(52) U.S. Cl.
CPC ..... *G01R 33/3621* (2013.01); *G01R 33/3692* (2013.01); *G01R 33/381* (2013.01)

(58) Field of Classification Search
CPC ............. G01R 33/381; G01R 33/0005; G01R 33/032; G01R 33/323; G01R 33/26
USPC ........................................................ 324/301
See application file for complete search history.

(56) References Cited

U.S. PATENT DOCUMENTS

| | | | |
|---|---|---|---|
| 9,829,545 B2* | 11/2017 | Stetson, Jr | G01R 33/032 |
| 9,891,297 B2 | 2/2018 | Sushkov et al. | |
| 9,910,104 B2* | 3/2018 | Boesch | G01R 33/032 |
| 9,910,105 B2* | 3/2018 | Boesch | G01R 33/032 |
| 10,120,039 B2* | 11/2018 | Stetson, Jr | G01R 33/0017 |
| 10,126,377 B2* | 11/2018 | Hahn | G01R 33/26 |
| 10,145,910 B2* | 12/2018 | Jackson | G01R 33/26 |
| 10,274,550 B2* | 4/2019 | Bruce | G01R 33/60 |
| 10,459,041 B2* | 10/2019 | Hahn | G01R 33/032 |
| 10,677,953 B2* | 6/2020 | Stetson | G01V 3/101 |
| 2014/0077231 A1* | 3/2014 | Twitchen | H01L 21/0405 257/77 |
| 2016/0356863 A1 | 12/2016 | Boesch et al. | |
| 2017/0146617 A1* | 5/2017 | Stetson, Jr | G01R 33/032 |
| 2020/0064419 A1 | 2/2020 | Barry et al. | |
| 2021/0405136 A1 | 12/2021 | Arroyo Camejo et al. | |

* cited by examiner

MEASUREMENT DEVICE AND METHOD FOR MEASURING MAGNETIC RESONANCE SIGNALS IN A MAGNETIC RESONANCE DEVICE AND MAGNETIC RESONANCE DEVICE

CROSS REFERENCE TO RELATED APPLICATIONS

This patent application claims priority to, and the benefit of, U.S. Provisional Patent Application No. 63/053,067, filed Jul. 17, 2020, which is incorporated herein by reference in its entirety.

BACKGROUND

Field

The disclosure concerns a measurement device and method for measuring magnetic resonance signals in a magnetic resonance device, and a magnetic resonance device.

Related Art

Magnetic resonance imaging (MRI) is a useful and established modality, in particular in medical imaging. An object to be imaged is placed in a main magnetic field (usually called B0 field) of the magnetic resonance device, such that spins align with the main magnetic field. If the spins are now excited using an excitation field ($B1^+$ field), this excitation decays, resulting in a $B1^-$ field which can be measured as the magnetic resonance signal. Gradient fields (in particular named Gx, Gy and Gz according to their respective gradient axis) can be applied to provide spatial encoding. The schedule of corresponding radio frequency pulses (for excitation), gradient pulses (for gradient fields) and readout time frames is usually called a magnetic resonance sequence.

Usually, reception coils, in particular made of copper, are used to measure the magnetic resonance signals. The sensitivity of magnetic resonance imaging at low field strength, for example at B0 field strengths smaller than 1 T (Tesla), is mainly limited by the coil noise and not by the patient noise as usual for high-field MRI. Even at higher field strengths, for example B0=3 T, and with smaller reception coil elements, for example loops having a diameter smaller than 7 cm, the signal-to-noise ratio (SNR) is also dominated by the coil noise. This fact limits the maximum number of reception coil elements (parallel RX channels) per reception coil and therewith the maximum acceleration factor R that could be achieved with parallel imaging. For some very special applications, like magnetic resonance devices for dedicated imaging tasks, for example dental MRI scanners, it will be very advantageous to be able to use loops of small size as reception coil elements, preferably less than 2 cm in diameter. However, in order to achieve the desired imaging sensitivity (defined by acceptable SNR), expensive dedicated magnetic resonance devices, for example dental MRI scanners, result, since they operate at very high field strengths (e.g. B0>3 T). Alternatively, the scan time may be increased, however, the necessary long scan times will not be acceptable for clinical applications.

There are some conventional solutions known to improve the MRI sensitivity beyond the limits imposed by reception coils, in particular copper coils. A promising approach are magnetic field quantum detectors. For example, the superconducting interference quantum devices (SQUIDs) exploit quantum effects to detect weak magnetic signals with high sensitivity. However, SQUIDs must be cooled to ultra-low (cryogenic) temperatures. Hence, their widespread application in clinical MRI, in particular close to a patient, is unpractical. Another type of quantum magnetometer is the optically pumped atomic magnetometer (OAM). An OAM is very sensitive and can measure at very low fields, but is limited to around 100 kHz in the maximum signal frequency it can detect. Thus, OAMs are applicable mainly for the ultra-low field (B0<10 mT) magnetic resonance devices.

Recently quantum spin magnetometers based on synthetic diamond doped with nitrogen impurities, which are also known as Nitrogen-Vacancy Centers (NVC), have been contemplated for use in MRI applications. These NVC magnetometers operate from static fields up to the frequency range used for the known clinical MRI scanners. Hence, they have been already proposed or contemplated as replacement for the prior art reception coils for MRI applications. For example, U.S. Pat. No. 9,891,297 B2 describes systems and methods for magnetic sensing and imaging using an NVC magnetometer, but does not describe how the sensors described therein could be integrated into a magnetic resonance device. U.S. Pat. No. 9,702,900 B2 discusses the use of an NVC sensor in sub-nanometer three dimensional magnetic resonance imaging. Another approach is described in pending German patent application DE 10 2020 208 180.8.

BRIEF DESCRIPTION OF THE DRAWINGS/FIGURES

The accompanying drawings, which are incorporated herein and form a part of the specification, illustrate the embodiments of the present disclosure and, together with the description, further serve to explain the principles of the embodiments and to enable a person skilled in the pertinent art to make and use the embodiments.

FIG. 1 an example diamond crystal lattice having a nitrogen vacancy center (NVC).

Figure 2:
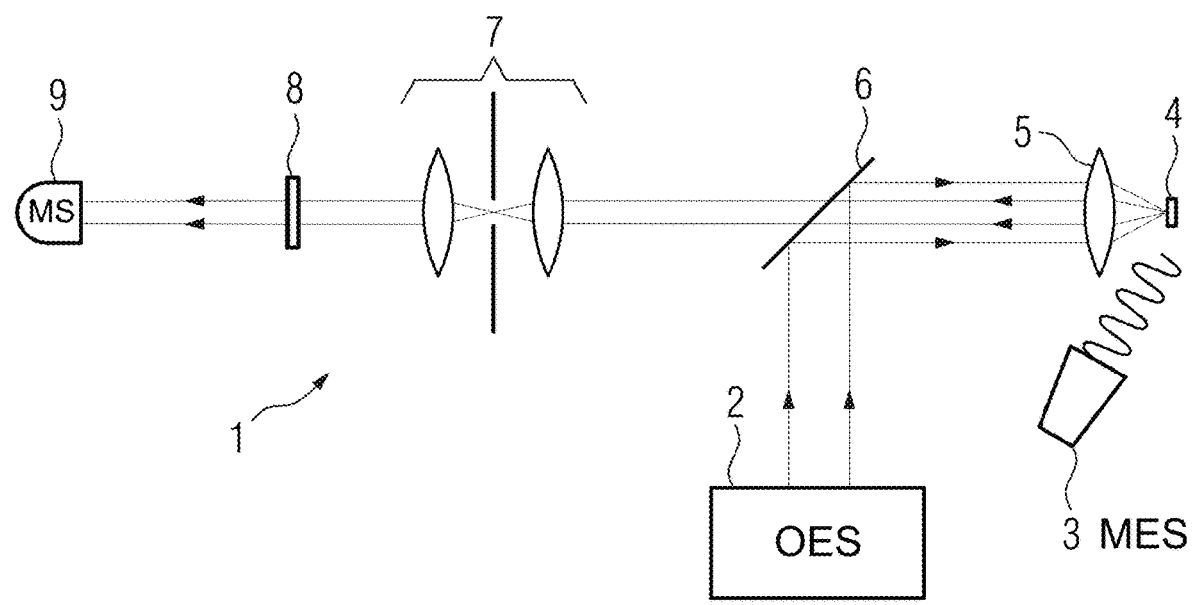

FIG. 2 a quantum spin sensor, according to an exemplary embodiment, using NVCs in diamond.

Figure 3:
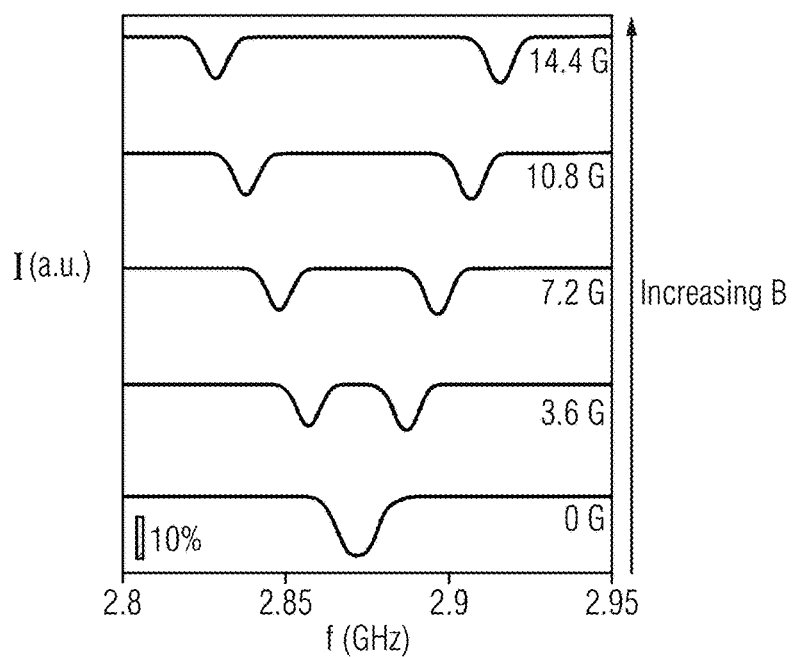

FIG. 3 ESR spectra for increasing magnetic field strengths according to an exemplary embodiment.

Figure 4:
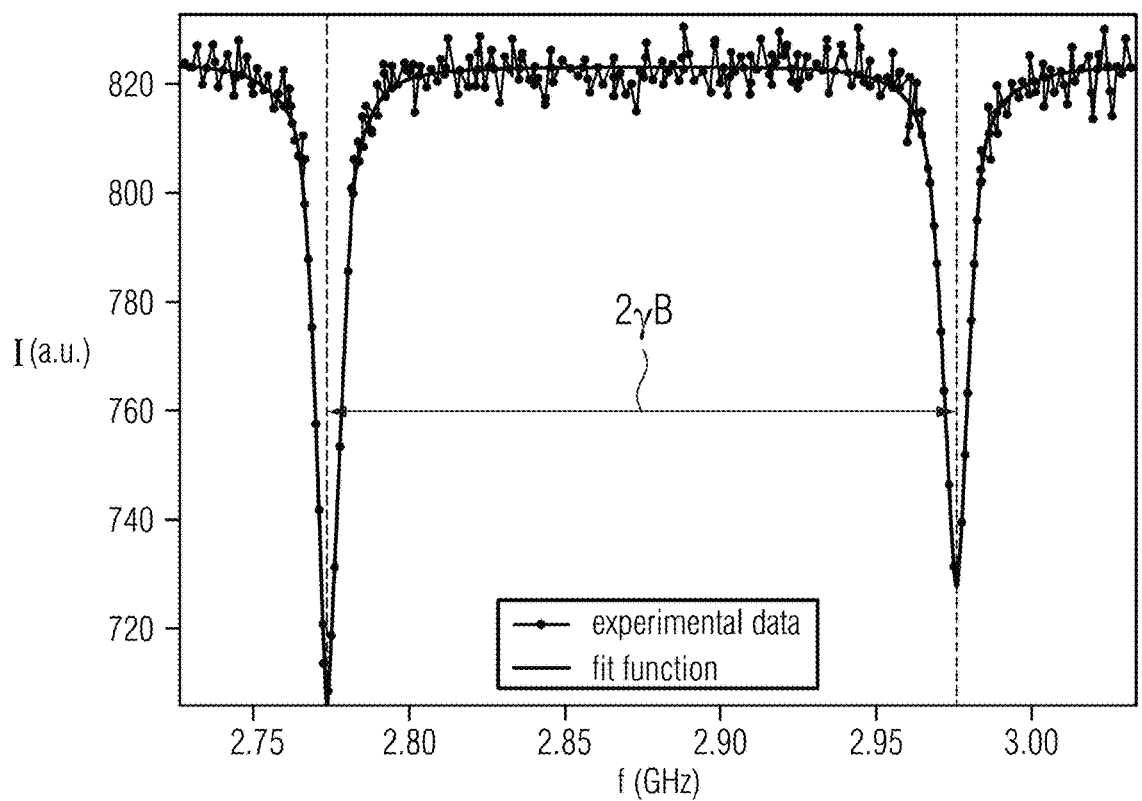

FIG. 4 a measured ESR spectrum with an interpolation curve according to an exemplary embodiment.

Figure 5:
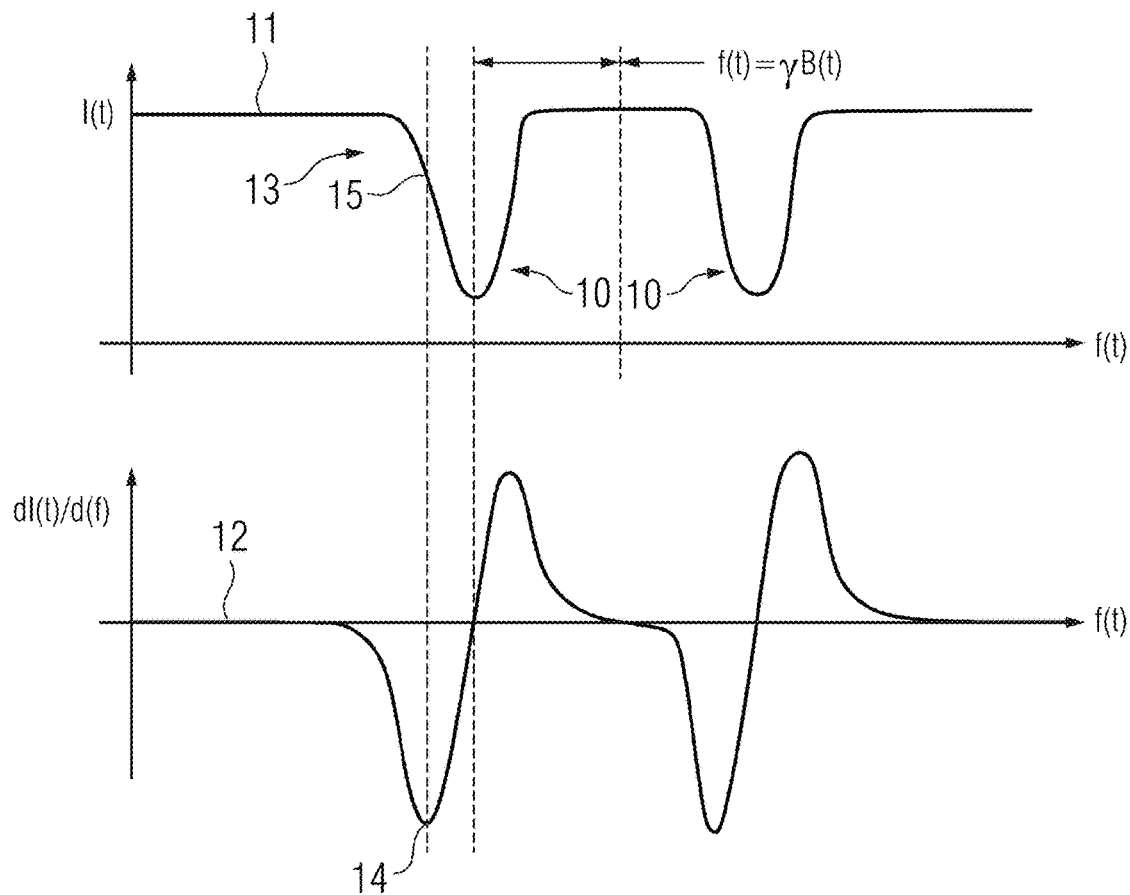

FIG. 5 an ESR spectrum together with a plot of its gradient with respect to the microwave frequency according to an exemplary embodiment.

Figure 6:
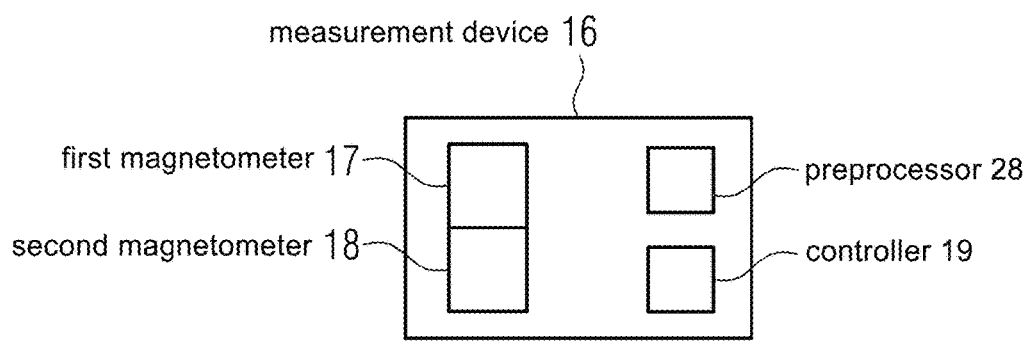

FIG. 6 a measurement device according to an exemplary embodiment.

Figure 7:
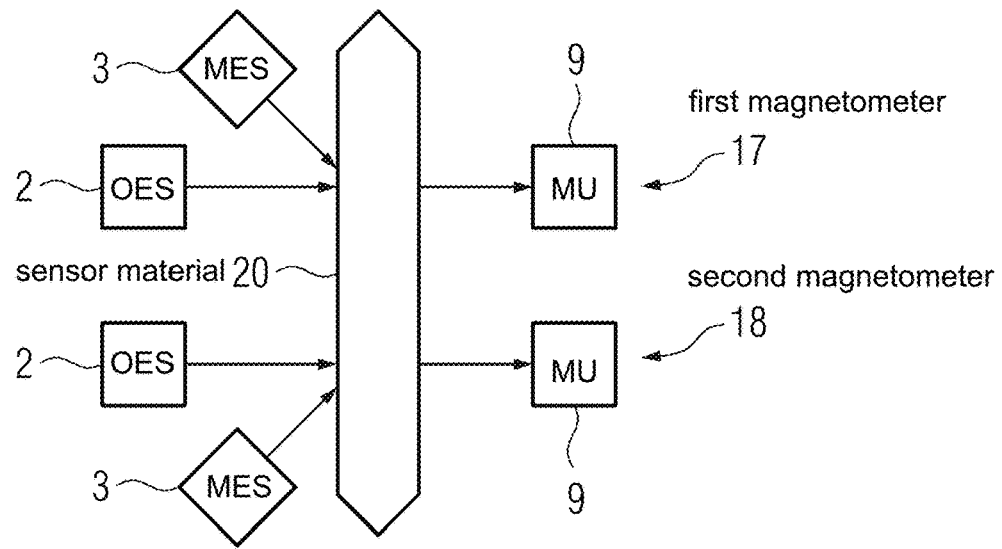

FIG. 7 components of an arrangement of a first and a second magnetometer using the same sensor material element, according to an exemplary embodiment.

Figure 8:
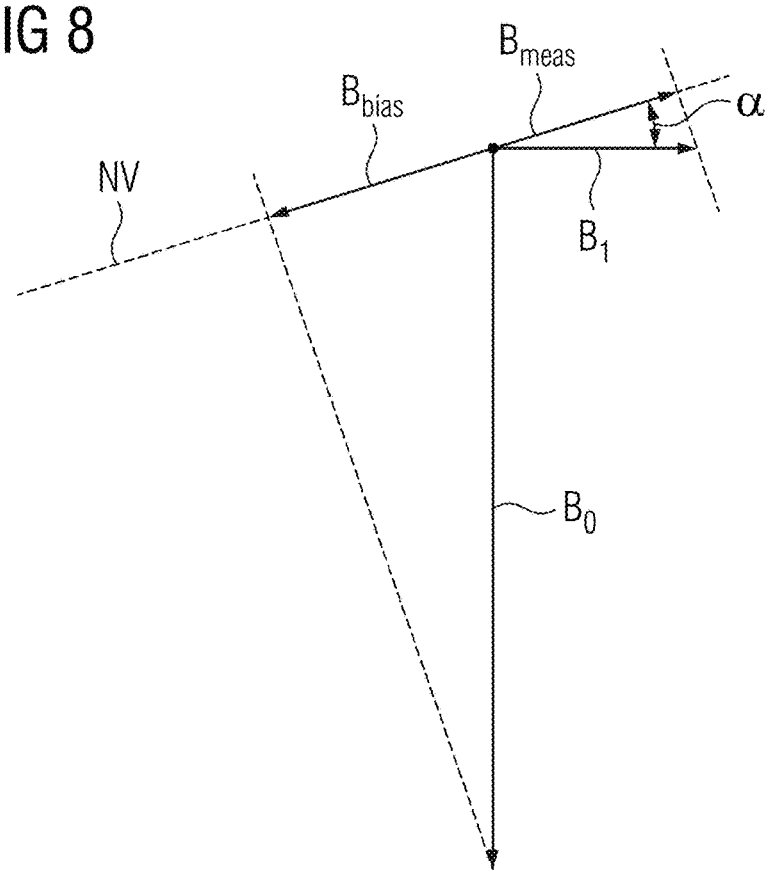

FIG. 8 a plot illustrating positioning of the measurement axis, according to an exemplary embodiment.

Figure 9:
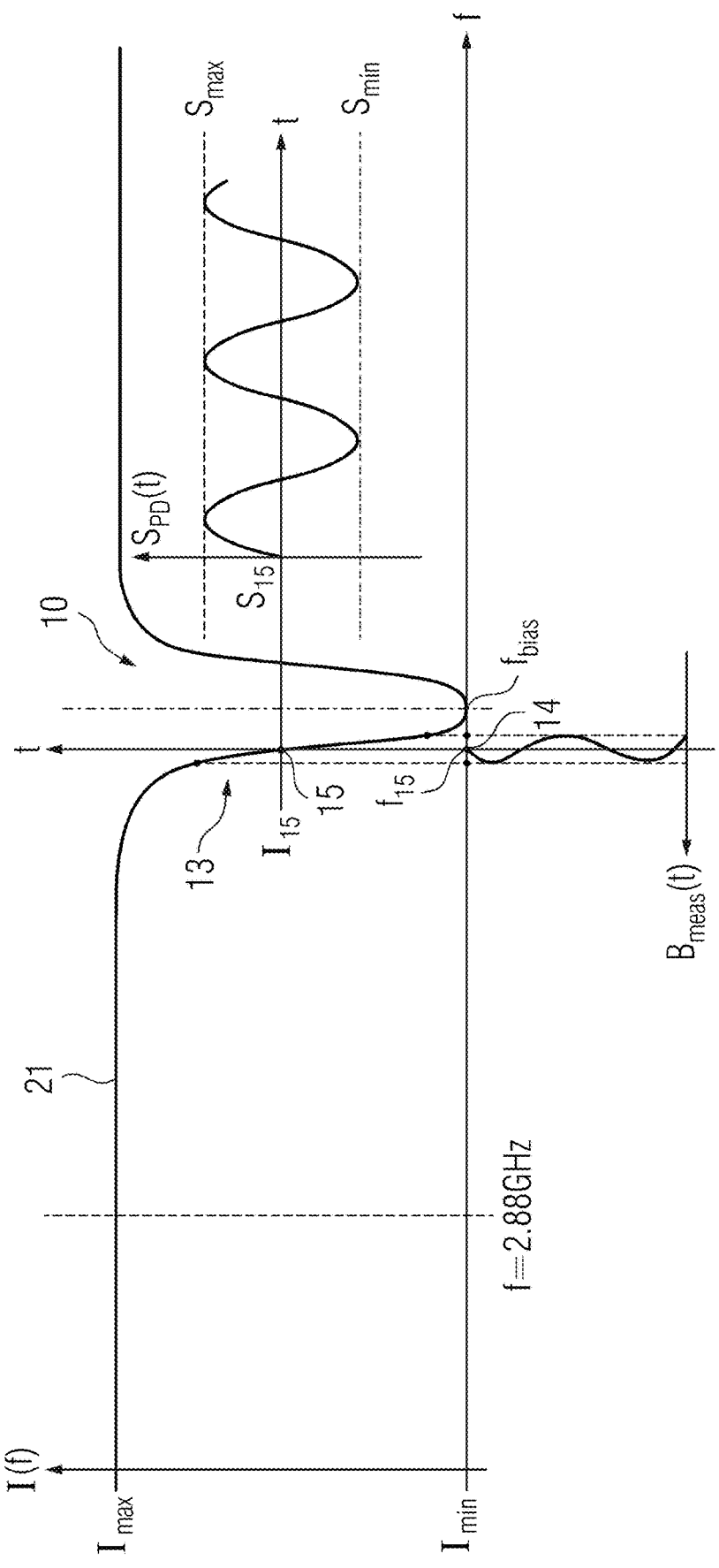

FIG. 9 a plot of a measurement principle according to an exemplary embodiment.

Figure 10:
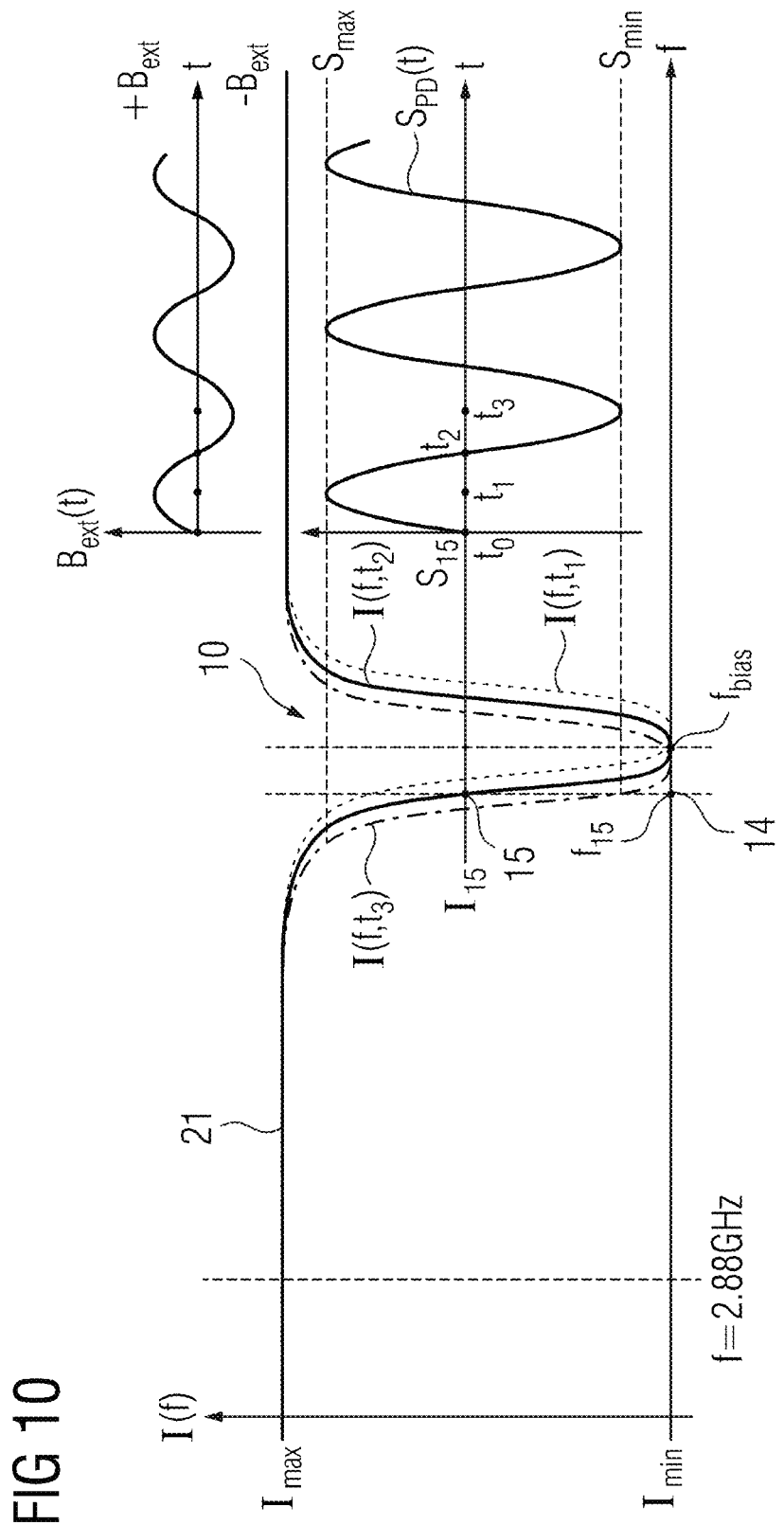

FIG. 10 a plot illustrating the measurement principle according to an exemplary embodiment.

Figure 11:
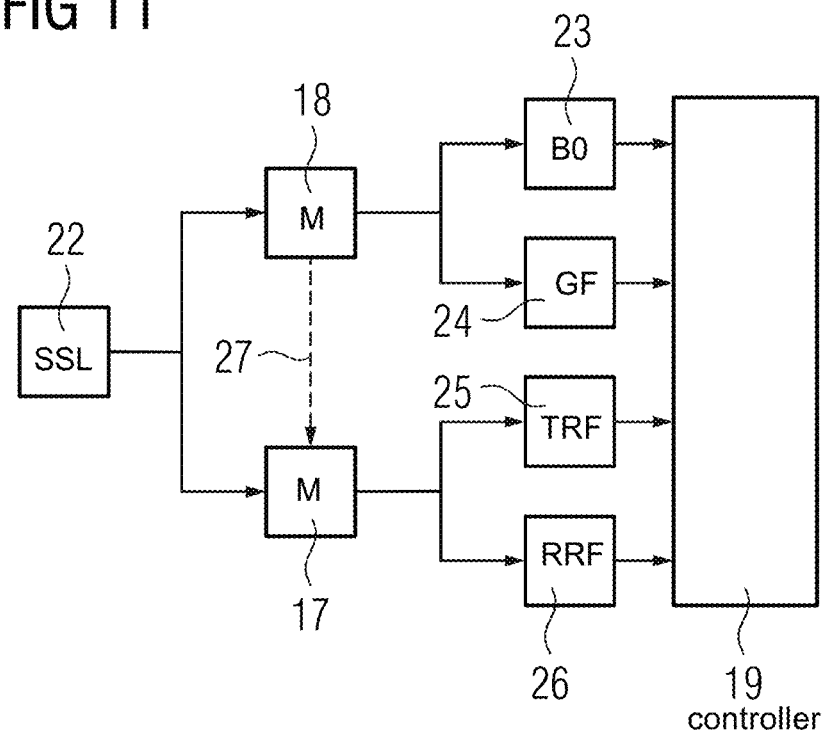

FIG. 11 a functional drawing of an embodiment of the disclosure.

Figure 12:
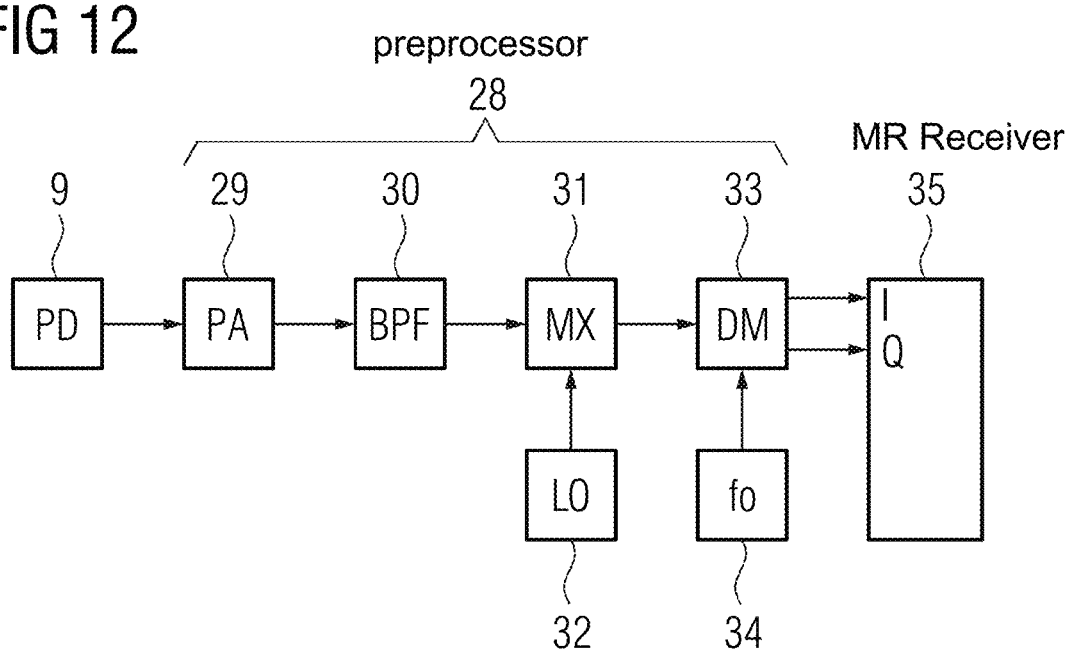

FIG. 12 a preprocessor according to an exemplary embodiment.

Figure 13:
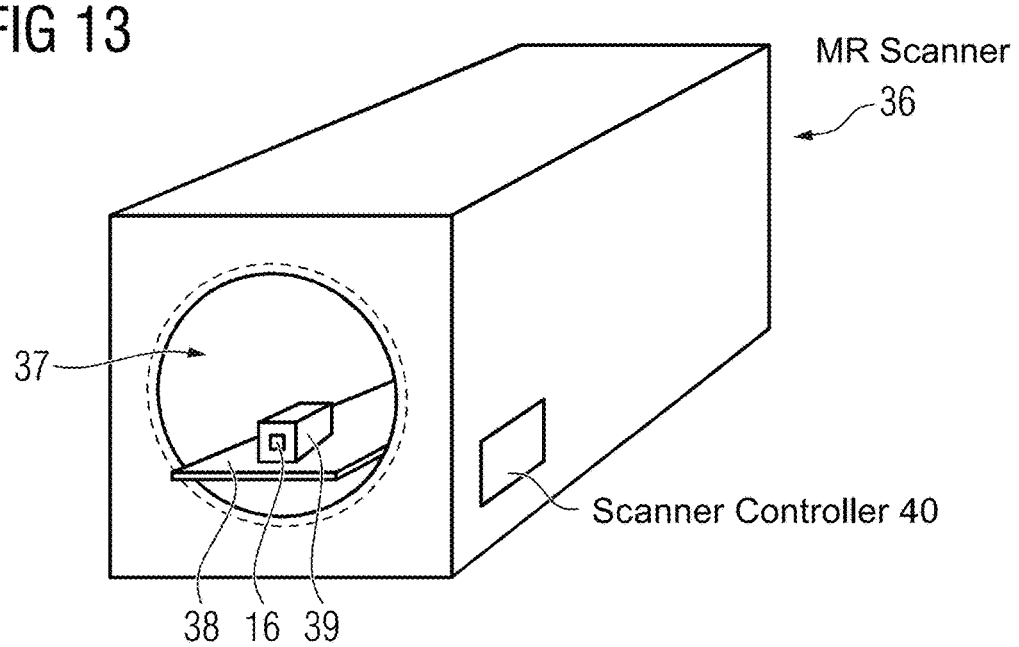

FIG. 13 a magnetic resonance device according to an exemplary embodiment.

Figure 14:
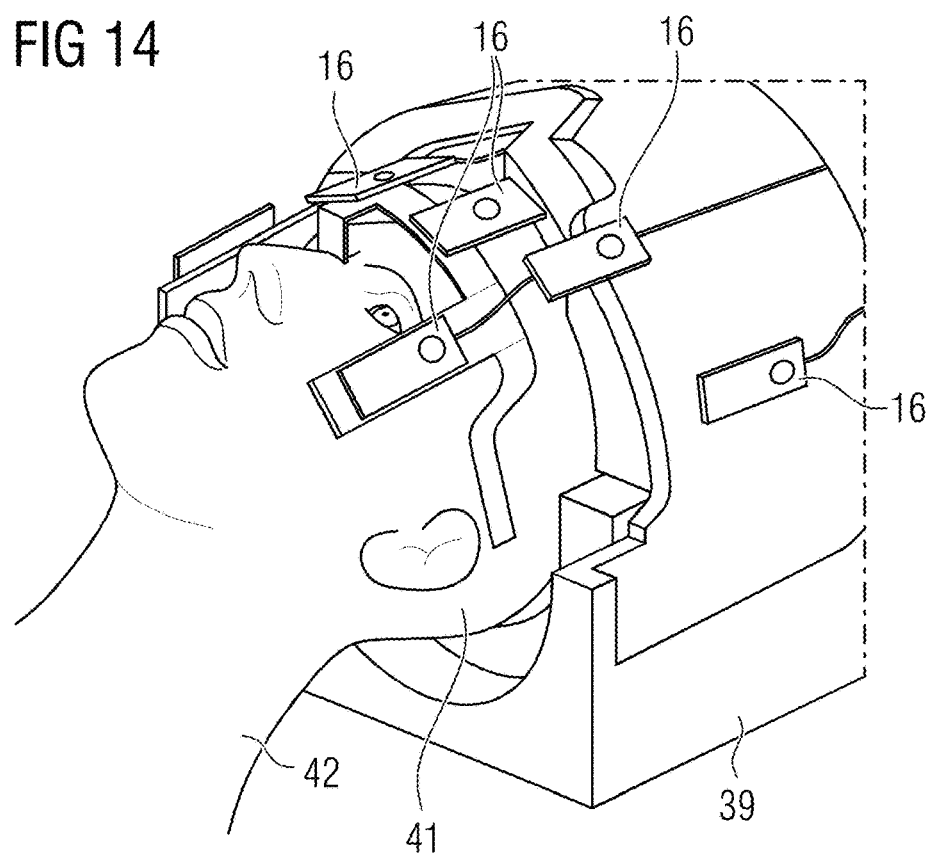

FIG. 14 a head reception device for magnetic resonance signals according to an exemplary embodiment.

The exemplary embodiments of the present disclosure will be described with reference to the accompanying drawings. Elements, features and components that are identical, functionally identical and have the same effect are—insofar as is not stated otherwise—respectively provided with the same reference character.

DETAILED DESCRIPTION

In the following description, numerous specific details are set forth in order to provide a thorough understanding of the embodiments of the present disclosure. However, it will be apparent to those skilled in the art that the embodiments, including structures, systems, and methods, may be practiced without these specific details. The description and representation herein are the common means used by those experienced or skilled in the art to most effectively convey the substance of their work to others skilled in the art. In other instances, well-known methods, procedures, components, and circuitry have not been described in detail to avoid unnecessarily obscuring embodiments of the disclosure. The connections shown in the figures between functional units or other elements can also be implemented as indirect connections, wherein a connection can be wireless or wired. Functional units can be implemented as hardware, software or a combination of hardware and software.

A quantum spin magnetometer may, for example, be based on synthetic diamond materials doped with nitrogen impurities, also known as Nitrogen-Vacancy Centers (NVC). FIG. 1 shows a diamond crystal lattice having an NVC defect. The vacancy V and the nitrogen atom N define the NV axis as one of the crystal axes. Further, the nearest carbon atoms C are shown. The negatively charged NVC has multiple quantic spin states and thus manifests certain electron spin resonance properties.

The NVC magnetometry is based on measurement of the Zeeman effect producing an energy shift of the spins having quantic states $m=\pm 1$, which hence are Zeeman splitting states. This energy shift depends linearly on the external magnetic field, which may thus be measured. There are many possible measuring arrangements and sensing procedures known from prior art that use NVC magnetometry for determining the strength of an external magnetic field, into which the sensor material, for example a small diamond as sensor material element, is immersed. For example, the ODMR (optically detected magnetic resonance) of NVC in diamond is disclosed by U.S. Pat. No. 9,910,105 B2.

An exemplary quantum spin magnetometer 1 which can be used for measuring the strength of the external magnetic field component that is oriented along the crystallographic NV axis is shown in FIG. 2. Two excitation sources 2, 3 are associated with the sensor material element 4, in this case a diamond, namely an optical excitation source 2, in this case a pump laser at 532 nm, and a microwave excitation source 3, which may be a microwave loop antenna, for example. A lens 5 is positioned adjacent to the sensor material element 4 to optimize the optical paths.

Fluorescence light emitted by the sensor material element 4 (in this case red light) passes the dichroic beamsplitter 6, a pinhole filter 7, and a longpass filter 8 to be measured by a measurement unit (measurement sensor) 9, which may, for example, comprise a photodiode, a photomultiplier, and/or a CCD camera.

The microwave excitation source 3 is controlled to emit a microwave frequency resonant with the transition energy between the ground spin state $m=0$ and the spin states $m=\pm1$ (Zeeman splitting states) further discussed below. By sweeping the microwave frequency of the microwave radiation applied to the NVCs, which have been pumped by green light of the optical excitation source 2 into spin state $m=0$, and by simultaneously measuring the intensity of the red fluorescence light (here having a wavelength of 689 nm), an electron spin resonance (ESR) spectrum builds up, that is, intensity versus microwave frequency. This spectrum shows two distinct absorption dips (also known as Lorentzian response profiles or Lorentzian dips) corresponding to the spin resonance frequency splitting between the Zeeman splitting states ($m=-1$ and $m=+1$). The frequency distance between the Lorentzian dips is proportional to the external magnetic field.

This is shown in FIG. 3. The ESR spectra, that is, amount of fluorescence light (intensity I) in arbitrary units versus the microwave frequency f, is shown for increasing external magnetic field B. In the absence of any external magnetic field B (0 G), a single absorption dip occurs at about 2.88 GHz. An external magnetic field B linearly splits the resonance into two symmetrically located absorption dips. FIG. 4 shows measured data and an interpolated fitting curve used to calculate the field strength of the external magnetic field in the NV axis direction. The two resonant dips are separated by a frequency distance $\Delta f = 2\gamma B$, where $\gamma \approx 28$ GHz/T is the gyromagnetic ratio of the electron.

It should be noted at this point that a vector valued external magnetic field strength can also be measured by quantum spin magnetometers, since usually, NVCs having different crystallographic axes as NV axis are used in a sensor material element 4, resulting in multiple pairs of absorption dips corresponding to these different NV axes.

The optically detected electron spin resonance (ESR) spectra, for instance, can be used for magnetic field sensing, as the spin resonance frequencies shift proportional to external magnetic fields. It has been shown that a single NVC in high purity (i.e., low defect concentration) diamond has a sensitivity of 30 nT $Hz_{-1/2}$ and it achieves even 4.3 nT $Hz_{-1/2}$ by isotopic engineering under ambient conditions. It is further possible to combine numerous NVCs in a very small micro-volume and thus to push the sensitivity limit even higher. For example, US 2020/0064419 A1 discloses a readout method that increases this sensitivity by many orders of magnitude in the range of a few pT $Hz_{-1/2}$.

As an alternative to NVCs in diamond, similar point defect or colour centres in other solid sensor materials (like e.g. silicon carbide crystals) can be used as active media for quantum spin magnetometers. Generally for MRI, it has also been proposed to use other types of wide-band, high-sensitivity magnetometers known from prior art, like for example optical atomic magnetometers, DC SQUID devices, high-temperature superconducting SQUIDS, atomic magnetometers using Bose-Einstein condensates, ultrasensitive $^3$He magnetometers, and the like.

However, both the OAM as well as the NVC magnetometers are non-resonant sensing devices, almost equally sensitive from static magnetic fields up the highest possible operating frequency. When used for magnetic resonance applications, in particular as a replacement for the reception coils, in particular resonant copper coils, these magnetometers face the problem that they will be exposed and sensitive to the static and strong main magnetic field B0 as well as to the pulsing magnetic gradient fields used for imaging. Thus, the challenge for such a sensor is to provide a huge dynamic range for the static magnetic field (for example having a field strength of 3T), modulated by pulsing gradient fields having amplitudes up to 0.05 T. Additionally, however, they should still be able to detect the very weak MR signals that are a few nT (nano-Tesla) in amplitude.

Conventionally, various methods are known to operate an NVC magnetometer or other quantum spin magnetometer at ultra-low field for nuclear magnetic resonance (NMR) and/ or microscopic (molecular size) MRI. Yet, there is an unmet need for new methods applicable for human body size MRI at high field that will provide a huge dynamic range (from a few nT up to a few T) and a very large frequency bandwidth, that is from static fields over a few Hz, covering the B0 fluctuations, over the kHz switching frequencies of the gradient fields up to hundreds of MHz, which is the Larmor frequency of the weak magnetic resonance signals.

In order to measure weak magnetic fields, as for example described in U.S. Pat. No. 9,910,105 B2 and explained with respect to FIG. 5, a local bias magnetic field $B_{bias}$ is applied to provide two corresponding absorption dips 10. In the upper half of FIG. 5, the ESR spectrum 11 is shown, in the lower half, the respective gradient 12 with respect to the microwave frequency f is shown. The idea is now to detect a characteristic point 15 in a steep section 13 of an absorption dip 10 of the ESR spectrum 11, in particular at the position 14 of the highest gradient of the absorption dip 10 (Lorentzian dip), since this is the point of highest sensitivity to deviations from the bias field.

This characteristic point 15 thus responds to the target magnetic field $B_{meas}(t)$, which is to be measured, if the total magnetic field is the combination of the target magnetic field and the bias field, $B_t(t)=B_{bias}+B_{meas}(t)$. Please note that, for simplicity, the explanation is for one defined NV axis, such that all magnetic field values mentioned above concretely refer to the projection of an arbitrarily oriented magnetic field along the NV axis depicted in FIG. 1.

To detect a change in the external magnetic field, a frequency sweep along the microwave frequency axis f(t) is performed and the curve dI(f)/d(f) is calculated to detect the characteristic point 15 where the frequency response is at its largest slope. Because the applied bias magnetic field $B_{bias}$ is already known and constant, a change or shift in the horizontal position 14 of the characteristic point 15 will be due to a change in the magnetic field to measure, $B_{meas}(t)$. Thus, knowing the frequency that corresponds to the characteristic point 15 permits to calculate the total magnetic field $B_t(t)$ and the unknown target magnetic field $B_{meas}(t)$.

However, this measurement method is not suitable for magnetic resonance devices, in particular clinical MRI scanners, because of two major limitations.

As a first limitation, the measurement process requires a long measurement time just to take a single sample of the target magnetic field. For every frequency step within a sweep, it is required to apply the microwave radiation for 1-500 μs and then to readout the optical fluorescence signal for 1-2 μs. The minimal measurement time required for one single frequency step will be 2 μs. If the frequency sweep comprises ten steps, then the sampling interval will be 20 μsec. Given that the magnetic resonance signals are in the range of many MHz (for example 24 MHz at 0.5 T), this sampling rate is far from Nyquist requirements. In this context, it is noted that there are other more sophisticated methods to measure the fluorescence signal like the ones using the Ramsey or the Hahn-echo methods—see, for example, the pending German patent application DE 10 2020 208 180.8. However, these approaches are even slower than the one described in detail above with respect to FIG. 5.

Also related approaches to detect a change in the total external magnetic field are this slow, since generally, the prior art performs a frequency sweep along the microwave frequency axis f(t) to find the location of at least one absorption dip. Thus, knowing the central frequency that corresponds to that absorption dip permits to calculate the total magnetic field $B_t(t)$ and the unknown target magnetic field $B_{ext}(t)$. The frequency sweep takes too long to complete, compared to the frequency of the magnetic resonance signals to measure. The Larmor frequencies $f_{mri}$ are, for example, in the range from 4.2 MHz at 0.1 T up to 123 MHz at 3 T.

As a second limitation, unlike as discussed above with respect to FIG. 5, there is no constant or known bias field applied to the magnetometer during a measurement in a magnetic resonance device. In other words, the requirement that the bias field $B_{bias}$ is known and remains constant during the whole frequency sweep is not met for MRI measurements. In the magnetic resonance device, there are deviations from the nominal static main magnetic field B0 during the scan, for example due to patient motion, respiratory motion and/or eddy currents induced by gradient activity within the patient body and/or other conductive parts. Additionally, the readout gradient fields are active during magnetic resonance signal measurement and will change the static magnetic field across the magnetometer, thereby affecting the bias field and the location of the absorption dips—and hence characteristic point 15—much more than the magnetic resonance signals. In particular, while the gradient field may have a strength of about 50 mT, the B1⁻ field only has a strength of a few nT. The exact value of the external magnetic field at the magnetometer location is not known with enough accuracy beforehand. Hence, the prior art method would be required to scan a very large band of microwave frequencies to find the absorption dips. This takes a very long time, not allowing to measure the magnetic resonance signals having a frequency in the MHz band.

An object of the disclosure is to provide a measurement device and method based on a quantum spin magnetometer, which allows to reliably measure magnetic resonance signals, in particular for MRI, by providing sufficiently high sampling frequency and high sensitivity, and which, in particular, can be easily used instead of conventional reception coils.

This object is achieved by providing a measurement device and method as well as a magnetic resonance device, in particular a clinical MRI scanner, according to the disclosure.

In an exemplary embodiment, a measurement device for measuring magnetic resonance signals in a magnetic resonance device comprises:

at least one quantum spin magnetometer as a first magnetometer, which comprises
  a sensor material element having at least one spin defect center, wherein the spin defect center has Zeeman splitting states dependent on an external magnetic field of the magnetic resonance device,
  an optical excitation source and a microwave excitation source for electromagnetically exciting the sensor material element, and
  a measurement unit for measuring optical signals emitted by the excited sensor material element and depending on the Zeeman splitting states,
a second magnetometer associated with the first magnetometer for measuring a total magnetic field strength of the external magnetic field, which acts as a bias field at the sensor material element of the first magnetometer,
a controller configured to determine a working frequency of the microwave excitation source of the first magnetometer from the total magnetic field strength measured by the second magnetometer, wherein the working frequency is a position of a maximum gradient of the optical signal with respect to the microwave frequency of the microwave excitation source, and control the microwave excitation source of the first magnetometer to use the determined working frequency as microwave frequency, such that the first magnetometer measures the analog magnetic resonance signals as the optical signal.

In an exemplary embodiment, the magnetic resonance signal may describe a $B1^-$ field, such that the output of the measurement unit of the first magnetometer, that is, the optical signal, in particular as an intensity, can be directly used for NMR and MRI measurements, as will be further described below.

In an exemplary embodiment of the disclosure, two magnetometers are combined in one measurement device, wherein the first magnetometer is configured to measure very small dynamic magnetic fields with a high sampling frequency, while the second magnetometer is adapted to measure higher fields, albeit at a lower sampling frequency. Hence, the first magnetometer may have a higher sensitivity than the second magnetometer. The second magnetometer measures a total external magnetic field to derive a defined working frequency as microwave frequency for the first magnetometer (instead of a frequency sweep). In typical MRI, the $B1^-$ field strength to be measured as the magnetic resonance signal may be at least by a factor $10^8$ smaller than the bias field strength and the $B1^+$ field strength may be at least by a factor $10^4$ smaller than the bias field strength.

The disclosure is based on two main ideas. The herein proposed solution makes use of the existing strong external magnetic field within the imaging space of the magnetic resonance device to provide a bias field for the sensitive first magnetometer, which is a quantum spin magnetometer as described above. However, in order to handle and compensate the variations in the external magnetic field, such as those associated with the magnetic gradient fields used for the spatial encoding of the magnetic resonance signals and drift effects, the new solution combines the highly sensitive quantum spin magnetometer with a robust magnetometer, in particular vector magnetometer, that measures the local bias field.

Furthermore, to significantly reduce the sampling time for the weak magnetic resonance signals, the new solution eliminates the frequency sweep method of the prior art discussed above and replaces it by a direct conversion of the varying $B1^-$ field into an analog optical signal at the output of the fluorescence measurement unit, for example comprising a photodiode and/or a photomultiplier and/or a photodetector and/or a CCD camera. This is achieved by choosing a defined working frequency, and thus a defined working point, for the microwave excitation source at which the optical signal, in particular a measured intensity, is extremely sensitive to small variations of the magnetic field, in particular in an at least approximately linear manner. This analog optical signal can be processed by the magnetic resonance device, in particular a receiver, just like analog coil signals received by conventional reception coils are processed. Hence, the new reception architecture is compatible with the hardware already existing in a prior art magnetic resonance device, in particular clinical MRI scanner. The first magnetometer can thus be described as a direct conversion high-sensitivity radio frequency (RF) magnetometer.

Hence, the combination of the two components described above (the highly sensitive first magnetometer measuring with a high sampling frequency and the second magnetometer) results in a hybrid magnetometer (the measurement device) providing the very high bandwidth and the very high dynamic range required for MRI applications. This combination device can measure in real time magnetic resonance signals and also multiple other parameters of the various magnetic fields used within a magnetic resonance device.

In an exemplary embodiments, the first magnetometer can be an NVC magnetometer, that is, the sensor material may be diamond having at least one nitrogen vacancy center as the spin defect center. NVC magnetometers are a well-established technology and will thus serve as the main example provided to describe the current disclosure. However, the disclosure is not so limited and the quantum spin sensor may also use other sensor materials having other spin defect centers, for example silicon carbide crystals.

In an exemplary embodiment, the Zeeman splitting states are dependent on a magnetic field component in a measurement direction of the spin defect center, wherein the first magnetometer is oriented at an angle between 45° and 90° regarding the direction of a B0 field of the magnetic resonance device. More preferably, the angle is between 80° and 90° or between 85° and 90°. In other words, these angles are angles between 0° and 45°, preferably 0° and 10°, and more preferably 0° and 5°, to the plane in which the $B1^-$ field rotates.

As explained above, for example in U.S. Pat. No. 9,910, 105 B2, in order to measure weak magnetic fields a constant bias field is applied across the volume of the quantum spin, in particular NVC, magnetometer. According to the disclosure, the first magnetometer (like the conventional reception coils) is located in the close vicinity of the imaging object, in particular a patient, within a magnetic resonance device, for example in the bore of a known cylindrical magnetic resonance device. Here, it is subject to all magnetic fields used during the measurement. Advantageously, the measurement device according to the disclosure indirectly and partially reuses the strong external magnetic field to provide the bias field proposed the prior art.

During a magnetic resonance measurement, the weak magnetic field $B1^-$ rotates around the direction of the main magnetic field (B0 field) and within a plane orthogonal to this B0 field direction at a frequency equal to the resonant Larmor frequency $f_{mri}$ of water protons in the magnetic resonance device. Similarly, the excitation field $B1^+$ also rotates around B0, yet in opposite direction to $B1^-$.

In a measurement device according to an exemplary embodiment, the first magnetometer is positioned in the strong external magnetic field of the magnetic resonance device such that the measurement direction, in particular the NV axis, is at an angle to both the B0 field direction and the plane in which the $B1^-$ field to be measured rotates. In an exemplary embodiment, the angle to the plane is small, since the projection of $B1^-$ onto the measurement direction, in particular the NV-axis, is what is measured. If the inclination angle is small, the projection is approximately equal to $B1^-$, such that the sensitivity for $B1^-$ is not decreased significantly. The bias field, on the other hand, results from the projection of the comparatively static external magnetic field onto the measurement direction, in particular NV axis. Since the external magnetic field, which is dominated by the B0 field, is by many orders larger than the $B1^-$ field, even at a larger inclination angle regarding the B0 field direction, the resulting bias field is much larger than the $B1^-$ field to be measured. For example, for B0=1.5 T at 5° angulation, $B_{bias}=0.13$ T and $B1^-=2$ nT, thus the field to measure is by a factor $10^8$ smaller than the bias field. It is noted that even regarding measurement of the $B1^+$ field, that is, the excitation field, using the first magnetometer, the strengths of the bias field and the target magnetic field to measure are many orders apart, since the $B1^+$ field strength may, for example, be as low as a few µT.

In summary, by choosing a small angle between the field to be measured and the measurement direction, preferably 5° or less, the sensitivity is not decreased significantly, yet a large bias field strength is made available. In particular, the angle can be chosen to provide an optimal working point for the used microwave excitation source, that is, an optimal working frequency, which directly depends on the bias field.

As already explained, the solution according to the disclosure avoids the time-consuming frequency sweep of the prior art. Instead, the targeted, fast-changing but weak magnetic field to measure is directly converted into an analog optical signal at the output of the measurement unit, for example a fluorescence photodetector. Hence, the sensitivity of the detection method is only limited by the shot noise in the measurement unit.

The current bias field (or at least total external magnetic field, on which the bias field depends) is known from the measurement of the second magnetometer. It is assumed to be approximately constant for at least a short interval of time of some microseconds or a few tens of microseconds. During this time interval, the controller adjusts the microwave frequency of the microwave radiation emitted by the microwave excitation source to a working frequency determined depending on the measurement of the second magnetometer. Since the working frequency is the location of largest gradient in the ESR spectrum, that is intensity versus microwave frequency curve, at one of the absorption dips for the measured total external magnetic field strength, the intensity versus microwave frequency curve can be approximated by a linear segment having the steepest possible gradient. This approximation achieves acceptable accuracy when the bias field strength is significantly larger than the target magnetic field strength of the field to be measured, in particular by at least a factor $10^3$ or $10^4$. For example, acceptable accuracy can be present if deviations from the linearity in a predetermined variation frequency interval due to the target magnetic field (in particular the $B1^-$ field) around the working frequency are less then 10 ppm, in particular less than 1 ppm.

The basic idea is now that a small variation of the external magnetic field, that is, a target magnetic field strength to measure, will slightly shift the absorption dip to one side, according to the sign of the variation. Hence, another point of the steep, approximately linear segment lies at the position of the working frequency, resulting in a change in intensity in the optical signal despite using the same working frequency, wherein the optical signal is, due to the linearity in the segment, linear in the magnetic field strength of the variation and thus the target magnetic field. The optical signal at the working frequency will hence be exactly reproducing the waveform of the target magnetic field to measure.

In exemplary embodiments, the second magnetometer may be a vector magnetometer. This, in particular, allows to measure the whole external magnetic field. Hence, the second magnetometer can be additionally used as a part of a field camera (which then comprises multiple second magnetometers at different positions in the magnetic resonance device). Such a field camera provides valuable information for the operation of the magnetic resonance device and, in particular, the imaging process. Concrete magnetic field parameters which could be measured and provided by the measurement device using the second magnetometer comprise the strength of the static main magnetic field, that is B0 field strength, which may, depending on the magnetic resonance device, for example lie in the range from 0.1 to 3 T and is a static value (0 Hz). Furthermore, the slow drift of the main magnetic field due to thermal effects, mechanical vibrations or ferromagnetic objects can be measured, which may be in a range of 0 to 0.5 mT regarding field strength and 0 to 100 Hz regarding frequency. The gradient fields Gx, Gy and Gz used for spatial encoding of the magnetic resonance signals and having respective ranges of 0 to 50 mT and 0 to 50 kHz may also be measured and determined as magnetic field parameters. These gradient field strengths can preferably also be used during image reconstruction or, generally speaking, generation of magnetic resonance data from the magnetic resonance signals.

As already discussed, the first magnetometer allows to measure $B1^+$ field strengths and waveform, that is, the transmit radio frequency signals used to excite the proton spins and to initiate the resonant spin relaxation process, which is then measured as the magnetic resonance signal. The $B1^+$ field has strengths in the range of 1 µT to 50 µT and vary with the respective Larmor frequencies. The first magnetometer further measures $B1^-$ field strength, that is the receive radio frequency field resulting from the decay of the spin excitation from inside the patient body. The respective optical signals are used as magnetic resonance signals, hence allowing to replace local radio frequency reception coils of the prior art. The field strength of the $B1^-$ field lies in a range of 1 nT to 10 nT, again at the respective Larmor frequency.

Hence, the measurement device in adapted to not only provide magnetic resonance signals, but also all relevant magnetic field parameters of the magnetic resonance device, covering a huge range of field strengths and variation time scales.

In an exemplary embodiment, the second magnetometer may also be a quantum spin magnetometer, in particular using the same sensor material element as the first magnetometer. For example, US 2016/0356863 A1 and DE 10 2018 203 845 A1 each disclose a magnetic field sensor (magnetometer) comprising a diamond with NVCs as a sensor material element, which may also be used in the current disclosure. These magnetometers are also capable of sensing and resolving a magnetic field vector. In a preferred approach, it is possible to realize the first, highly sensitive RF magnetometer and the second magnetometer on the same sensor material element, in particular diamond crystal, by using some of the spin defect centers, in particular NVCs, for the first magnetometer and another subgroup of the spin defect centers, in particular NVCs, for the second magnetometer. This not only allows a highly integrated construction of the measurement device, but also to measure the strength and the direction of the external magnetic field at the location of the first magnetometer. The strength of the local bias field becomes known accurately and may be used to adjust the working frequency of the microwave radiation applied by the microwave excitation source.

But also generally, in an exemplary embodiment, the first and second magnetometers have a distance of less than 10 mm, preferably less than 1 mm, to as accurately as possible measure the total external magnetic field strength at the position of the first magnetometer.

As an alternative to a quantum spin sensor, the second magnetometer may also be a Hall magnetometer and/or optically pumped atomic magnetometer and/or use another measurement principle. For example, U.S. Pat. No. 6,800,913 B2 discloses a hybrid vector magnetometer realized with Hall devices.

As already explained, during the imaging process, the strong external magnetic field inside the magnetic resonance device, that is, in its imaging volume, is continuously varying, in particular due to the signal encoding gradient fields and/or drift effects. The total external magnetic field strength at the spatial location given by the coordinates (x,y,z) can be written as $B_t(x,y,z)=B0+Gx \cdot x+Gy \cdot y+Gz \cdot z$, B0 already including drift effects. Consequently, the bias field applied across the first magnetometer varies over time. The magnitude of this change depends on the local coordinates and can be as high as 50 mT or larger for strong gradient fields. For most magnetic resonance sequences and during the readout time interval (wherein the magnetic resonance signals are sampled), the gradient field is almost constant in time. However, the bias field varies spatially due the encoding gradients and may also drift during the readout due to, for example, eddy currents or thermal drift. This variability needs to be taken into account. Hence, the controller may control the second magnetometer to regularly measure the total external magnetic field strength to detect changes in the strength of the local bias field. If the second magnetometer is a quantum spin magnetometer, for example, frequency sweeps may be used.

In an exemplary embodiment, the controller is configured to control the second magnetometer to measure the magnetic field strength cyclically and to update the working frequency at least if an updating condition is fulfilled. The update time interval, that is the cycle length, may, in particular, be 5 to 200 µs, for example 10 or 100 µs. The measured total external magnetic field strength is used to update the value of the working frequency applied to the first magnetometer, such that the working point remains at the steepest gradient of the chosen absorption dip in the ESR spectrum (intensity versus microwave frequency curve, also called Lorentzian curve).

In exemplary embodiments, small changes in the bias field may be tolerated without updating the working frequency. In particular, relatively low sampling frequencies, as exemplified above, may be sufficient for the second magnetometer. The reason for this is that the strength of the $B1^-$ (or even $B1^+$) field to measure is so low that the abovementioned predetermined variation frequency interval due to the $B1^-$ field is much smaller than the linearity frequency interval of the linear segment of the ESR spectrum around the working frequency. Therefore, an adjustment of the working frequency can proceed at large update time intervals, for example every 10 µs or every 100 µs.

Even after such a new measurement of the second magnetometer, the newly measured total external magnetic field strength may not justify updating the working frequency at this point in time. Such cases may be described by the updating condition. In particular, the updating condition may be fulfilled if a predetermined variation frequency interval due to the $B1^-$ field at a potential new working frequency lies at least partially outside a linearity frequency interval of the optical signal with respect to the microwave frequency at the current working frequency. Hence, as long as sufficient linearity remains, an update can be skipped.

In an exemplary embodiment, the controller is configured to adjust to a new working frequency from a previous working frequency stepwise over an, in particular predetermined, time interval. That is, an adjustment of the working frequency may proceed in a gentle manner, that is with very small steps for an almost continuous ramping over, for example, a time interval of 10 µsec in between two values and not as an abrupt update step. Preferably, the predetermined length of the time interval may be equal to the cycle length. Slowly ramping to a new working frequency reduces perturbations occurring in the analogue output optical signal due to the update of the working frequency. To reduce contaminations of the analog magnetic resonance signal provided by the measurement device due to the stepwise update, a simple high-pass filter or bandpass filter may be used to preprocess the signal.

In exemplary embodiments, the controller may determine the working frequency based on calibration information of a calibration measurement stored in a storing means of the controller. The calibration information may, for example, comprise a look-up table and/or characteristic curve allowing to associate a working frequency with a measured total magnetic field strength. For calibration, different strengths of the external magnetic field can be set, in particular by correspondingly controlling respective components of the magnetic resonance device, for example the gradient system, and by using a frequency sweep of the microwave frequency, the working frequency can be determined as the position of highest gradient.

For example, the calibration measurement can be performed by controlling the magnetic resonance device to generate multiple different calibration total field strengths at the measurement device and, for each calibration total field strength, performing a frequency sweep of the microwave excitation source of the first magnetometer to determine the maximum gradient and the associated calibration working frequency. During the frequency sweep, the calibration total field strength is measured using the second magnetometer. Subsequently, the calibration information for arbitrary total magnetic field strengths in a measurement range may be determined from the calibration total magnetic field strengths and their associated calibration working frequencies, in particular by fitting and/or interpolating and/or extrapolating. The measurement range may comprise all total magnetic field strengths occurring during measurement operation of the magnetic resonance device as designed. The calibration measurement may be controlled by a scanner controller of the magnetic resonance device.

In exemplary embodiments, the measurement device may further comprise a preprocessor for preprocessing the analog magnetic resonance signal, the preprocessor comprising at least one chosen from the group comprising:
- a preamplifier, in particular a low noise transimpedance amplifier,
- a bandpass filter having a passband around the Larmor frequency of the magnetic resonance device,
- a frequency conversion device to perform frequency conversion to an intermediate frequency, and
- a synchronous signal demodulator for separating the in-phase and quadrature components.

An amplifier, in particular a low noise transimpedance amplifier, may thus be used to, on the one hand, amplify the weak magnetic resonance signal from the measurement unit, on the other hand to convert current to voltage for easier further preprocessing. A bandpass filter having a passband around the Larmor frequency allows to filter out unwanted interference and/or disturbance signals as well as noise. In particular, the bandpass filter may remove disturbances regarding adjustment of the working frequency as discussed above. The passband may, for example, comprise all frequencies in a 0.5 to 3 MHz band centered around the Larmor frequency.

The frequency conversion device may comprise a mixer driven by a local oscillator to convert the magnetic resonance signal to an intermediate frequency, in particular one not interfering with the measurement process. Finally, a synchronous signal demodulator may be employed to separate the I/Q components of the magnetic resonance signal, which may then be forwarded to receiver components of the magnetic resonance device for digitalization and further processing. The disclosure further concerns a magnetic resonance device comprising at least one measurement device according to the disclosure. All features and remarks regarding the measurement device correspondingly apply to the magnetic resonance device according to the disclosure, such that the same advantages can be achieved. Preferably, the magnetic resonance device may be a clinical MRI scanner, in particular a whole body scanner for human patients.

A magnetic resonance device according to an exemplary embodiment the disclosure may comprise:
- a main magnet unit for generating the main magnetic field (B0 field) and having a bore for receiving a patient, in particular on a patient table,
- a gradient system having at least one gradient coil, in particular three gradient coils, for generating gradient fields, in particular Gx, Gy, and Gz,
- a radio frequency excitation system for generating excitation pulses in an imaging volume in the bore, in particular for generating a $B1^+$ field,
- at least one measurement device, preferably multiple measurement devices, for measuring magnetic resonance signals, and
- a scanner controller.

In an exemplary embodiment, each measurement device of the magnetic resonance device comprises:
- at least one quantum spin magnetometer as a first magnetometer, which comprises
  - a sensor material element having at least one spin defect center, wherein the spin defect center has Zeeman splitting states dependent on an external magnetic field of the magnetic resonance device,
  - an optical excitation source and a microwave excitation source for electromagnetically exciting the sensor material element, and
  - a measurement unit for measuring optical signals emitted by the excited sensor material element and depending on the Zeeman splitting states,
- a second magnetometer associated with the first magnetometer for measuring a total magnetic field strength of the external magnetic field, which acts as a bias field at the sensor material element of the first magnetometer,
- a controller configured to determine a working frequency of the microwave excitation source of the first magnetometer from the total magnetic field strength measured by the second magnetometer, wherein the working frequency is a position of a maximum gradient of the optical signal with respect to the microwave frequency of the microwave excitation source, and control the microwave excitation source of the first magnetometer to use the determined working frequency as microwave frequency, such that the first magnetometer measures the analog magnetic resonance signals as the optical signal.

In an exemplary embodiment, the scanner controller comprises a magnetic resonance receiver, wherein the magnetic resonance receiver receives and processes the analog magnetic resonance signals of the at least one measurement device to determine magnetic resonance data. In particular, multiple measurement devices are used and placed at measurement positions preferably surrounding an imaging region of the patient, such that the measurement devices act as a replacement for known local reception coil elements. Each measurement device may provide the analog magnetic resonance signal, in particular the I and Q components as described above, to the magnetic resonance receiver, where magnetic resonance data, in particular magnetic resonance images, can be determined by evaluation of the magnetic resonance signals. In particular, the same hardware as with conventional reception coils can be used.

In an exemplary embodiment, each second magnetometer may be a vector magnetometer used as a part of a field camera consisting of multiple second magnetometers. In this case, of course, each measurement device may also provide magnetic field parameters as described above. Multiple differently positioned measurement devices, in particular their second magnetometers, may then work together as a field camera. The scanner controller, for example the receiver regarding gradient fields, may also be configured to process this additional information, in particular regarding the determination of magnetic resonance data.

In exemplary embodiments, the scanner controller and/or the controller (of the measurement device) is configured to determine a B0 field strength and/or at least one gradient field strength from sensor data of the second magnetometer and/or to control the measurement device to also measure a $B1^+$ field using the first magnetometer. For example, using B0 field strengths provided as magnetic field parameter by multiple measurement devices, a B0 field map may be determined, for example used for correction of magnetic resonance data and/or to control at least one shim device of the magnetic resonance device. Gradient field strengths as magnetic field parameters may, in particular, be used when reconstructing magnetic resonance images from the magnetic resonance signals. The $B1^+$ field strength and waveform may be used to construct B1 field maps, for example for parallel transmission systems.

As already discussed above, the scanner controller may also be configured to determine calibration information for determining the working frequency from the total magnetic field strength by
- controlling the magnetic resonance device to generate multiple different calibration total field strengths at the measurement device,
- for each calibration total field strength, performing a frequency sweep of the microwave excitation source of the first magnetometer to determine the maximum gradient and the associated calibration working frequency and measuring the calibration total field strength using the second magnetometer,
- determining the calibration information for arbitrary total magnetic field strengths in a measurement range from the calibration total magnetic field strengths and their associated calibration working frequencies, in particular by interpolation and/or extrapolation and/or fitting.

Preferably, the scanner controller may be configured to perform a calibration measurement before each magnetic resonance measurement, or at least regularly, to always have up-to-date calibration data also taking sensor aging and the like into account.

In an exemplary embodiment, the scanner controller may be configured to use 5 to 100 calibration total field strengths and/or 300 to 600 sampling points in the calibration frequency sweep. Such a calibration measurement yields sufficient results to determine accurate calibration information, yet does not take too long. For example, the duration of a calibration measurement may be 0.5 to 2 seconds, for example one second.

It is noted that the scanner controller may comprise at least one processor and/or at least one data storage means. Regarding the controller, it may, for example, be realized as a microcontroller, FPGA or the like, in particular having an integrated or external storage means, for example for the calibration information. It is, however, also possible to implement the controller as having one or more processors and/or storage means.

Finally, the disclosure also concerns a method for measuring magnetic resonance signals in a magnetic resonance device using a measurement device, in particular according to the disclosure, the measurement device comprising at least one quantum spin magnetometer as a first magnetometer, which comprises
  a sensor material element having at least one spin defect center, wherein the spin defect center has Zeeman splitting states dependent on an external magnetic field of the magnetic resonance device,
  an optical excitation source and a microwave excitation source for electromagnetically exciting the sensor material element, and
  a measurement unit for measuring optical signals emitted by the excited sensor material element and depending on the Zeeman splitting states,
a second magnetometer associated with the first magnetometer for measuring a total magnetic field strength of the external magnetic field, which acts as a bias field at the sensor material element of the first magnetometer, and
a controller, wherein the method comprises the following steps performed by the controller:
controlling the second magnetometer to measure a current total external magnetic field strength,
determining a working frequency for the microwave excitation source of the first magnetometer from the total magnetic field strength measured by the second magnetometer, wherein the working frequency is a position of a maximum gradient of the optical signal with respect to the microwave frequency of the microwave excitation source,
controlling the microwave excitation source of the first magnetometer to use the determined working frequency as microwave frequency,
controlling the first magnetometer to measure the analog magnetic resonance signals as the optical signal of the measurement unit.

All features, comments and remarks regarding the measurement device according to the disclosure and the magnetic resonance device according to the disclosure correspondingly apply to the method according to the disclosure, such that the same advantages can be achieved.

FIG. 6 is a schematical drawing of a measurement device 16 according to the disclosure, which can be used as a replacement for a reception coil element in a magnetic resonance device, in particular a clinical whole-body MRI scanner. The measurement device 16 hence mainly measures the $B1^-$ field to generate magnetic resonance signals describing the decay of spins excited by a respective $B1^+$ field, but can also determine additional magnetic field parameters and measure the $B1^+$ field. The measurement device 16 may be referred to as a magnetic sensor as the magnetic sensor measures/senses one or more magnetic fields and generates corresponding magnetic resonance signals. In an exemplary embodiment, the measurement device 16 includes processing circuitry that is configured to perform one or more functions and/or operations of the measurement device 16. In one or more aspects, one or more of the components of the measurement device 16 (e.g. magnetometers 17, 18; controller 19; and/or preprocessor 28) includes processing circuitry that is configured to perform one or more respective functions and/or operations of the component(s).

The measurement device 16 comprises two magnetometers 17, 18, namely a first magnetometer 17 which has a high sensitivity and high time resolution and is especially configured to measure the weak $B1^-$ field at Larmor frequency, and a second magnetometer 18 with a lesser sensitivity and temporal resolution to measure the total external magnetic field strength, in particular at least a component used as a bias field for the first magnetometer 17. The first magnetometer 17 is a quantum spin magnetometer, preferably an NVC magnetometer as, for example, shown in FIG. 2. The high temporal resolution allowing measurements in the MHz regime of usual Larmor frequencies is achieved by choosing one working frequency for the microwave excitation source 3 instead of performing a frequency sweep.

The measurement device 16 further comprises a controller 19 controlling its operation. In particular, the controller 19, which may be a microcontroller (pC) or other processor, is configured to determine the working frequency from the current total external magnetic field strength measured by the second magnetometer 18. Reverting to FIG. 5, the working frequency is a position 14 of a maximum gradient of the optical signal measured by the measurement unit 9, intensity I, with respect to the microwave frequency of the microwave excitation source 3. However, instead of performing successive frequency sweeps and tracking the position 14, the combination of first and second magnetometers 17, 18 exploits the fact that the segment 13 around the characteristic point 15 is at least approximately linear. As the target magnetic field to measure, here at least the $B1^-$ field, is way smaller than the bias field provided by the strong, static external magnetic field in the magnetic resonance device, this weak target magnetic field only causes the position of the absorption dip 10 and hence the linear segment 13 to slightly shift horizontally, as further explained below, such that the optical signal provides the accurate waveform of the target magnetic field and can be used as the magnetic resonance signal. In an exemplary embodiment, the controller 19 includes processing circuitry that is configured to perform one or more functions and/or operations of the controller 19.

The strong, at least essentially static fields in the magnetic resonance device also vary spatially, such that the magnetometers 17, 18 are positioned close to each other, in particular closer than 10 mm or even, preferably, closer than 1 mm. In this context, FIG. 7 shows a preferred embodiment schematically, in which both the first and second magnetometers 17, 18 are quantum spin magnetometers using the same sensor material element 20, in particular different and disjoint subgroups of spin defect centers of the sensor material element 20. The sensor material is, again, diamond, and as spin defect centers, NVCs are used. Preferably, the second magnetometer 18 is a vector magnetometer adapted to measure all components of the total external magnetic field.

Each magnetometer 17, 18 comprises an optical excitation source 2, a microwave excitation source 3 and a measurement unit 9, in this case a photodetector. For simplicity, optical elements as indicated in FIG. 2 are not shown here.

To use the strong external magnetic field, which is dominated by the B0 field, as a bias field, the NV axis (as explained above with respect to FIG. 1) for the chosen absorption dip 10 is positioned at a small angle, preferably of 5° or less, to the plane in which B1⁻ rotates, and which is orthogonal to the B0 field direction. This is illustrated in FIG. 8.

In such an arrangement the first magnetometer 17, here an NVC magnetometer, is positioned in the external magnetic field of the magnetic resonance device, here represented by its dominating component B0, such that there is small angle α in between the target magnetic field to measure (the radio frequency field B1) and the NV axis. The B1 field rotates within a plane orthogonal to B0. The effective field to measure $B_{meas}$ results as the projection of B1 onto the NV axis. At small inclination angle α, $B_{meas}$ is approximatively equal to B1, therewith the sensitivity for B1 does not decrease significantly. The bias field $B_{bias}$ results as the projection of the external magnetic field, represented by B0, onto the NV axis. Even at small inclination angle α, the resulting bias field $B_{bias}$ is much larger than the field to measure $B_{meas}$. For example, for B0=1.5 T at 5° angulation, $B_{bias}$=0.13 T and $B_{meas}$=2 nT (for B1⁻), thus the target magnetic field strength to measure is $10^8$ smaller than the bias field strength. Please note that, of course, FIG. 8 is not to scale.

Preferably, the NV axis is oriented at an angle α of less than or equal 5° to the plane in which B1 rotates. Still, a very large value of the bias field strength as related to the target magnetic field strength to be measured is made available.

In the following, it will be described with respect to FIGS. 9 and 10 how, at a large sampling frequency, a direct, proportional conversion of the B1⁻ field waveform to the optical signal (intensity of the fluorescence light) provided by the measurement unit 9 (photodetector) is achieved, such that the optical signal can be directly used as magnetic resonance signal.

FIG. 9 illustrates the principle of the direct signal conversion. The application of the bias field, as described above, will shift the location of one absorption dip 10 on the fluorescence curve from the zero-field location at 2.88 GHz toward the right side to the new location $f_{bias}$=2.88 GHz+ γ·$B_{bias}$, with γ≈28 GHz/T. The following table shows example values for $f_{bias}$.

| $B_{bias}$ [T] | 0.1 | 0.5 | 1 |
|---|---|---|---|
| $f_{bias}$ [GHz] | 5.68 | 16.88 | 30.88 |

Assuming that the bias magnetic field (or at least the external magnetic field providing the bias field) is known and is approximatively constant for at least a short interval of time of some microseconds or a few tens of microseconds, the controller 19 adjusts the microwave frequency of the microwave radiation of the microwave excitation source 3 of the first magnetometer 17 to a value $f_{15}$ (the working frequency). This sets the working point (corresponds to characteristic point 15 of highest gradient on the ESR spectrum, curve 21) at location 14. At and around this location the curve 21 can be approximated by a straight-line, that is linear, segment 13 having the steepest possible gradient, ensuring the maximum sensitivity for this direct conversion method. This approximation achieves acceptable accuracy when $B_{bias}$ is significantly larger than $B_{meas}$. The required value for $f_{15}$ can be calibrated beforehand by conducting a full frequency sweep at various total magnetic field strengths, as further described below.

In the absence of any target magnetic field to measure, $B_{meas}$=0, the resulting fluorescence light has an intensity $I_{15}$ in-between $I_{min}$ and $I_{max}$. The resulting optical signal intensity value $S_{PD}$ at the measurement unit 6 (photodetector) output is $S_{15}$ located in-between $S_{min}$ and $S_{max}$. A weak external magnetic field $B_{meas}$ applied across the first magnetometer 17 will gently shift the absorption dip 10 and therewith the working point 15 along the linear segment 13 of the curve 21. Consequently, the optical signal $S_{PD}$ at the photodetector output will change proportionally, accurately reproducing the waveform of the target magnetic field to measure. Note that, in FIGS. 9 and 10, for the sake of clarity the amplitudes of $B_{meas}$ and changes related thereto as compared to the size of the absorption dip 10 are strongly exaggerated. In reality, these signal amplitudes are so low that they will not be discernible at this scale.

FIG. 10 is another intuitive depiction of the way this direct conversion works. In this figure, the curve 21 is also denoted I(f, $t_2$). The target magnetic field to measure $B_{meas}$(t) simply "jitters" the horizontal location of the absorption dip 10 in-between two extreme lateral positions shown as curves I(f,$t_1$) and I(f,$t_3$) that correspond to the maximum and minimum values of the total magnetic field $B_{bias}$+$B_{meas,max}$ and respectively $B_{bias}$−$B_{meas,max}$. The corresponding frequency interval may, for example, be approximated beforehand and named variation frequency interval. The working point 15, which is the intersection between the vertical line at working frequency $f_{15}$ and the jittering absorption dip 10, results in different fluorescence light intensities, which in turn modulates the optical signal $S_{PD}$ at the measurement unit 9 (photodetector) output between $S_{min}$ and $S_{max}$. In this manner, the waveform of the target magnetic field to measure, in particular the B1⁻ field's projection onto the NV axis, is linearly reproduced.

FIG. 11 shows a functional schematic regarding the measurement device 16, coarsely explaining the use of the measurement device 16 as a multiparametric hybrid magnetometer. The multiparametric total external magnetic field to be measured at the sensor spatial location 22 consists in a mixture of various field components, namely nominal B0 field,
ΔB0, that is slow drift of B0 due to thermal effects, mechanical vibrations and/or ferromagnetic objects,
Gx, Gy, and Gz, that is the gradient fields used for spatial encoding,
B1⁺ field, that is the excitation field (radio frequency transmit) to excite the spins and to initiate the resonant spin relaxation process, and
B1⁻ field.

Of course, not all these field components may or will occur at same time. Depending on the magnetic resonance sequence used for the acquisition, for example to generate a target image contrast, various field combinations follow each other according to a certain chronology. For example, the B1⁺ and B1⁻ fields usually do not overlap temporally, whilst for the most cases not all the gradient fields are simultaneously active on all three Cartesian axes. It also known that the B0 field and the gradient fields are mainly oriented along the Z axis of the magnetic resonance device with only very small (erroneous) components within the X-Y plane. Furthermore, the B1 field vectors are orthogonal to the B0 field direction (Z axis) and rotate at Larmor frequency around the B0 field direction (Z axis) within the X-Y plane, as already explained above. In particular, they do not have a Z component.

Multiple of these magnetic field components at the location 22 of the measurement device 16 may be sampled by the combination of the two magnetometers 17, 18, ideally located very close to each other, preferably less than 1 mm apart. The second magnetometer 18, in this case a slow-speed but high-range vector magnetometer, measures the local value of the total external magnetic field strength. This could be further separated into static or slow drift B0 field (B0+ΔB0) (box 23) and fast switching gradient fields Gx·x+Gy·y+Gz·z (box 24). The first magnetometer 17 as a highly sensitive radio frequency magnetometer is used to detect the transmit (box 25) and receive (box 26) radio frequency B1 fields, thereby replacing the conventional reception coils. The dashed link 27 between the second magnetometer 18 and the first magnetometer 17 symbolizes that the last one reuses a measurement result from the first one to enable fast and accurate operation. The device controller 19 receives all the measured sensor data and controls the operation of the whole measurement device 16.

It is noted that sensor data, in particular magnetic field parameters, concerning other field components than the B1$^-$ field may also be sent to a scanner controller of the magnetic resonance device, for example to be used in determining magnetic resonance data from the magnetic resonance signal, correcting magnetic resonance data and/or controlling the magnetic resonance device, for example regarding shimming and parallel transmission.

As explained above, the bias field can be assumed as at least essentially constant over, for example, a few tens of microseconds, but not necessarily over a whole readout interval in a magnetic resonance sequence. Hence, the controller 19 is adapted to cyclically update the working frequency of the microwave excitation source 3 of the first magnetometer 17, wherein the cycle duration may, for example, be 10 μs or 100 μs. That is, every 10 μs or 100 μs, the controller 19 controls the second magnetometer 18 to measure the current total external magnetic field strength. However, very small variations in the total external magnetic field strength do not in every case require an update of the working frequency, since, as explained above, the, in particular predetermined, variation frequency interval may be much smaller than the linearity frequency interval, for which linearity of the linear segment 13 to a certain accuracy can be assumed. Hence, the controller 19, for every newly measured total external magnetic field strength, checks whether an updating condition is fulfilled, which is the case if the predetermined variation frequency interval due to the B1$^-$ field at a potential new working frequency lies at least partially outside the linearity frequency interval of the optical signal with respect to the microwave frequency at the current working frequency.

If the working frequency is to be updated, this is not done abruptly in one step, but in a smooth manner stepwise over a certain, in particular predetermined, time interval, which may be 10 μs or simply correspond to the cycle duration.

From total external magnetic field strengths, in some embodiments, the controller 19 may determine the working frequency using calibration information determined in a calibration measurement, which may, for example, take place before every magnetic resonance measurement. In such a calibration measurement, which may be controlled by the scanner controller of the magnetic resonance device, multiple different calibration total field strengths at the measurement device are generated, for example by correspondingly controlling the gradient system of the magnetic resonance device. For each generated calibration total field strength, the first magnetometer 17 performs a frequency sweep of the microwave excitation source 3 to determine the maximum gradient and the associated calibration working frequency (at position 14), while the second magnetometer 18 measures the calibration total field strength. From these sensor data, that is the calibration total magnetic field strengths and their associated calibration working frequencies, the controller 19 or the scanner controller 40 of the magnetic resonance device determines the calibration information for arbitrary total magnetic field strengths in a measurement range (for example external magnetic field strength possible during magnetic resonance measurements with the magnetic resonance device).

Preferably, the optical signal used as analog magnetic resonance signal may be preprocessed before being fed to a magnetic resonance receiver of the scanner controller 40 of the magnetic resonance device. To this end, the measurement device 16 may comprise a preprocessor 28 (see FIG. 6).

FIG. 12 exemplary depicts a preprocessor 28 as used for preprocessing of the analog optical signal at the output of the first magnetometer 17. The weak optical signal at the output of the measurement unit 9, in this case a photodetector, is preamplified by a low noise transimpedance amplifier 29 and then conditioned to eliminate perturbations outside the signal bandwidth of interest (in this embodiment using a passband of 1 MHz around the Larmor frequency) by a bandpass filter 30. This also removes effects of a (smooth) transition to a new working frequency.

Optionally, there may be a frequency conversion to a lower intermediate frequency by a mixer 31 driven by a local oscillator 32, hence forming a frequency conversion device. Finally, a synchronous signal demodulator 33 separates the (I,Q) components of the complex magnetic resonance signal to be further processed by the magnetic resonance receiver 35 of the scanner controller 40 of the magnetic resonance device. Oscillator 34 generates a reference frequency.

FIG. 13 is a schematic drawing showing a magnetic resonance (MR) device (MR scanner) 36, in this case a whole-body clinical MRI scanner, according to the disclosure. The magnetic resonance device 36 comprises, as known from the art, a main magnet unit 37 comprising an, in particular superconducting, main magnet for generating the main magnetic field (B0 field). The main magnet unit 36 has a bore 37 into which a patient may be introduced for MRI measurements using a patient table 38. Surrounding the bore 37, a gradient system 39 comprising three gradient coils for the three Cartesian axes X, Y, and Z is indicated. A radio frequency excitation system (transmit system), comprising a body coil, is not shown for simplicity, but may also be arranged enclosing the bore 37. Local radio frequency excitation systems (transmit systems) may, of course, also be used.

For receiving magnetic resonance signals, in this case, a local reception device 39 for the head of the patient is used, which is equivalent to a local head coil of the prior art. Additionally, of course, other local reception devices 39 may be provided. Each local reception device comprises multiple measurement units 16 according to the disclosure, as described above, of which as least a part acts as a replacement for conventional reception coil elements.

A controller ("scanner controller") 40 is configured to control the operation of the magnetic resonance device 36. The scanner 40 may include magnetic resonance receiver 35. It is also configured to perform calibration measurements as described above. In an exemplary embodiment, the controller 40 includes processing circuitry that is configured to perform one or more functions and/or operations of the controller 40. The controller 40 may be referred to as "scanner controller" 40 to avoid confusion with respect to the controller 19 of the measurement device 16.

FIG. 14 shows an example for a local reception device 39 for the head 41, comprising multiple measurement devices 16. While a part of these measurement device 16 are positioned at fixed locations, in particular at an angle as discussed above, to act as a replacement for reception coils, some measurement devices 16 may also be movable with the head 41 to detect movement of the head 41 of the patient 42.

Hence, the local reception device 39 can act as a replacement for a conventional local head coil, wherein the conventional reception coil elements are replaced by measurement devices 16 according to the disclosure.

Although the present disclosure has been described in detail with reference to the preferred embodiment, the present disclosure is not limited by the disclosed examples from which the skilled person is able to derive other variations without departing from the scope of the disclosure.

To enable those skilled in the art to better understand the solution of the present disclosure, the technical solution in the embodiments of the present disclosure is described clearly and completely below in conjunction with the drawings in the embodiments of the present disclosure. Obviously, the embodiments described are only some, not all, of the embodiments of the present disclosure. All other embodiments obtained by those skilled in the art on the basis of the embodiments in the present disclosure without any creative effort should fall within the scope of protection of the present disclosure.

It should be noted that the terms "first", "second", etc. in the description, claims and abovementioned drawings of the present disclosure are used to distinguish between similar objects, but not necessarily used to describe a specific order or sequence. It should be understood that data used in this way can be interchanged as appropriate so that the embodiments of the present disclosure described here can be implemented in an order other than those shown or described here. In addition, the terms "comprise" and "have" and any variants thereof are intended to cover non-exclusive inclusion. For example, a process, method, system, product or equipment comprising a series of steps or modules or units is not necessarily limited to those steps or modules or units which are clearly listed, but may comprise other steps or modules or units which are not clearly listed or are intrinsic to such processes, methods, products or equipment.

References in the specification to "one embodiment," "an embodiment," "an exemplary embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The exemplary embodiments described herein are provided for illustrative purposes, and are not limiting. Other exemplary embodiments are possible, and modifications may be made to the exemplary embodiments. Therefore, the specification is not meant to limit the disclosure. Rather, the scope of the disclosure is defined only in accordance with the following claims and their equivalents.

Embodiments may be implemented in hardware (e.g., circuits), firmware, software, or any combination thereof. Embodiments may also be implemented as instructions stored on a machine-readable medium, which may be read and executed by one or more processors. A machine-readable medium may include any mechanism for storing or transmitting information in a form readable by a machine (e.g., a computer). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact results from computing devices, processors, controllers, or other devices executing the firmware, software, routines, instructions, etc. Further, any of the implementation variations may be carried out by a general-purpose computer.

For the purposes of this discussion, the term "processing circuitry" shall be understood to be circuit(s) or processor(s), or a combination thereof. A circuit includes an analog circuit, a digital circuit, data processing circuit, other structural electronic hardware, or a combination thereof. A processor includes a microprocessor, a digital signal processor (DSP), central processor (CPU), application-specific instruction set processor (ASIP), graphics and/or image processor, multi-core processor, or other hardware processor. The processor may be "hard-coded" with instructions to perform corresponding function(s) according to aspects described herein. Alternatively, the processor may access an internal and/or external memory to retrieve instructions stored in the memory, which when executed by the processor, perform the corresponding function(s) associated with the processor, and/or one or more functions and/or operations related to the operation of a component having the processor included therein. In one or more of the exemplary embodiments described herein, the memory is any well-known volatile and/or non-volatile memory, including, for example, read-only memory (ROM), random access memory (RAM), flash memory, a magnetic storage media, an optical disc, erasable programmable read only memory (EPROM), and programmable read only memory (PROM). The memory can be non-removable, removable, or a combination of both.

The invention claimed is:

1. A measurement device for measuring magnetic resonance (MR) signals in a MR device, the measurement device comprising:

at least one quantum spin magnetometer as a first magnetometer, which includes:
    a sensor material including at least one spin defect center having Zeeman splitting states dependent on an external magnetic field of the MR device,
    an optical excitation source and a microwave excitation source configured to electromagnetically excite the sensor material, and
    a measurement sensor configured to measure optical signals emitted by the excited sensor material and depending on the Zeeman splitting states,
a second magnetometer associated with the first magnetometer configured to cyclically measure a total magnetic field strength of the external magnetic field, which acts as a bias field at the sensor material of the first magnetometer, and
a controller configured to:
    determine a working frequency of the microwave excitation source of the first magnetometer from the total magnetic field strength measured by the second magnetometer, wherein the working frequency is a position of a maximum gradient of the optical signal with respect to the microwave frequency of the microwave excitation source, update the determined working frequency, at least if an updating condition is fulfilled, based on the cyclically measured total magnetic field strength, and control the microwave excitation source of the first magnetometer to use the determined working frequency as a microwave frequency, such that the first magnetometer measures the MR signals as the optical signal.

2. The measurement device according to claim 1, wherein the sensor material is diamond having at least one nitrogen vacancy center as the spin defect center.

3. The measurement device according to claim 1, wherein the Zeeman splitting states are dependent on a magnetic field component in a measurement direction of the spin defect center, the first magnetometer being oriented at an angle between 45° and 90° regarding the direction of a B0 field of the MR device.

4. The measurement device according to claim 3, wherein the angle is between 80° and 90° or between 85° and 90°.

5. The measurement device according to claim 1, wherein the second magnetometer is a vector magnetometer.

6. The measurement device according to claim 1, wherein the second magnetometer is a quantum spin magnetometer using the same sensor material as the first magnetometer.

7. The measurement device according to claim 1, wherein the updating condition is fulfilled if a predetermined variation frequency interval due to the B1− field at a potential new working frequency lies at least partially outside a linearity frequency interval of the optical signal with respect to the microwave frequency at the current working frequency.

8. The measurement device according to claim 1, wherein the controller is configured to adjust to a new working frequency from a previous working frequency stepwise over a predetermined time interval.

9. The measurement device according to claim 1, wherein the controller is configured to determine the working frequency based on calibration data of a calibration measurement stored in the controller or accessed by the controller.

10. The measurement device according to claim 1, further comprising a preprocessor configured to preprocess one or more of the MR signals, the preprocessor comprising:
a low noise transimpedance amplifier,
a bandpass filter having a passing band around the Larmor frequency of the MR device,
a frequency converter configured to perform frequency conversion to an intermediate frequency, and/or
a synchronous signal demodulator configured to separate in-phase and quadrature components.

11. A magnetic resonance (MR) device, comprising:
at least one measurement device configured to measure MR signals in the MR device, the at least one measurement device including:
at least one quantum spin magnetometer as a first magnetometer, which includes:
a sensor material including at least one spin defect center having Zeeman splitting states dependent on an external magnetic field of the MR device,
an optical excitation source and a microwave excitation source configured to electromagnetically excite the sensor material, and
a measurement sensor configured to measure optical signals emitted by the excited sensor material and depending on the Zeeman splitting states,
a second magnetometer associated with the first magnetometer configured to measure a total magnetic field strength of the external magnetic field, which acts as a bias field at the sensor material of the first magnetometer,
a controller configured to:
determine a working frequency of the microwave excitation source of the first magnetometer from the total magnetic field strength measured by the second magnetometer, wherein the working frequency is a position of a maximum gradient of the optical signal with respect to the microwave frequency of the microwave excitation source, and
control the microwave excitation source of the first magnetometer to use the determined working frequency as a microwave frequency, such that the first magnetometer measures the MR signals as the optical signal; and
at least one scanner controller having a magnetic resonance receiver configured to receive and process the MR signals of the at least one measurement device to determine MR data, wherein the at least one scanner controller is further configured to determine calibration information for determining the working frequency from the total magnetic field strength by:
controlling the MR device to generate multiple different calibration total field strengths at the at least one measurement device,
for each calibration total field strength, performing a frequency sweep of the microwave excitation source of the first magnetometer to determine the maximum gradient and the associated calibration working frequency and measuring the calibration total field strength using the second magnetometer, and
determining the calibration information for arbitrary total magnetic field strengths in a measurement range from the calibration total magnetic field strengths and their associated calibration working frequencies.

12. The MR device according to claim 11, wherein each second magnetometer is a vector magnetometer, the second magnetometers forming a field camera.

13. The MR device according to claim 12, wherein the at least one scanner controller and/or the controller is configured to:
determine a B0 field strength and/or at least one gradient field strength from sensor data of the second magnetometer, and/or
control the measurement device to also measure a B1+ field using the first magnetometer.

14. A computer-implemented method for measuring magnetic resonance (MR) signals in a magnetic resonance device using a measurement device having a first magnetometer and a second magnetometer, the method comprising:
controlling the second magnetometer to measure a current total external magnetic field strength cyclically,
determining a working frequency for a microwave excitation source of the first magnetometer from the total external magnetic field strength measured by the second magnetometer, the working frequency being a position of a maximum gradient of an optical signal with respect to a microwave frequency of the microwave excitation source, wherein the determined working frequency is updated, at least if an updating condition is fulfilled, based on the cyclically measured current total external magnetic field strength, controlling the microwave excitation source of the first magnetometer to use the determined working frequency as microwave frequency, and controlling the first magnetometer to measure the MR signals as the optical signal of a measurement sensor of the first magnetometer.

15. The computer-implemented method according to claim 14, wherein:

the first magnetometer is a quantum spin magnetometer, the first magnetometer further including:

a sensor material including at least one spin defect center having Zeeman splitting states dependent on an external magnetic field of the MR device, and an optical excitation source, the optical excitation source and the microwave excitation source being configured to electromagnetically excite the sensor material, wherein the measurement sensor is configured to measure optical signals emitted by the excited sensor material and depending on the Zeeman splitting states, the second magnetometer is associated with the first magnetometer, the total external magnetic field strength of the external magnetic field acting as a bias field at the sensor material of the first magnetometer, and the measurement device further includes a controller configured to:

determine the working frequency of the microwave excitation source of the first magnetometer from the total external magnetic field strength measured by the second magnetometer, the working frequency being a position of a maximum gradient of the optical signal with respect to the microwave frequency of the microwave excitation source, and control the microwave excitation source of the first magnetometer to use the determined working frequency as a microwave frequency, such that the first magnetometer measures the MR signals as the optical signal.

16. A non-transitory computer-readable storage medium with an executable program stored thereon, that when executed, instructs a processor to perform the method of claim 14.

17. A measurement device for measuring magnetic resonance (MR) signals in a MR device, the measurement device comprising:

at least one quantum spin magnetometer as a first magnetometer, which includes:

a sensor material including at least one spin defect center having Zeeman splitting states dependent on an external magnetic field of the MR device, an optical excitation source and a microwave excitation source configured to electromagnetically excite the sensor material, and a measurement sensor configured to measure optical signals emitted by the excited sensor material and depending on the Zeeman splitting states, a second magnetometer associated with the first magnetometer configured to measure a total magnetic field strength of the external magnetic field, which acts as a bias field at the sensor material of the first magnetometer, a controller configured to:

determine a working frequency of the microwave excitation source of the first magnetometer from the total magnetic field strength measured by the second magnetometer, wherein the working frequency is a position of a maximum gradient of the optical signal with respect to the microwave frequency of the microwave excitation source, and control the microwave excitation source of the first magnetometer to use the determined working frequency as a microwave frequency, such that the first magnetometer measures the MR signals as the optical signal, and a preprocessor configured to preprocess one or more of the MR signals, the preprocessor including: a low noise transimpedance amplifier, a bandpass filter having a passing band around the Larmor frequency of the MR device, a frequency converter configured to perform frequency conversion to an intermediate frequency, and/or a synchronous signal demodulator configured to separate in-phase and quadrature components.

* * * * *